US012574048B2

(12) United States Patent
Tran et al.

(10) Patent No.: US 12,574,048 B2
(45) Date of Patent: Mar. 10, 2026

(54) SIGMA-DELTA ANALOG-TO-DIGITAL CONVERTER TO GENERATE DIGITAL OUTPUT FROM VECTOR-BY-MATRIX MULTIPLICATION ARRAY

(71) Applicant: Silicon Storage Technology, Inc., San Jose, CA (US)

(72) Inventors: Hieu Van Tran, San Jose, CA (US); Andrew Kunil Choe, San Jose, CA (US); Hoa Vu, Milpitas, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 115 days.

(21) Appl. No.: 18/426,071

(22) Filed: Jan. 29, 2024

(65) Prior Publication Data

US 2025/0167799 A1 May 22, 2025

Related U.S. Application Data

(60) Provisional application No. 63/601,049, filed on Nov. 20, 2023.

(51) Int. Cl.
*H03M 3/00* (2006.01)
*G06F 17/16* (2006.01)
*H03M 1/46* (2006.01)

(52) U.S. Cl.
CPC ............ *H03M 3/464* (2013.01); *G06F 17/16* (2013.01); *H03M 1/466* (2013.01)

(58) Field of Classification Search
CPC ........ H03M 3/464; H03M 1/466; G06F 17/16
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan | |
| 10,403,339 B2 * | 9/2019 | Baker | G11C 11/5678 |
| 10,534,840 B1 | 1/2020 | Petti | |
| 10,748,630 B2 | 8/2020 | Tran | |
| 11,074,318 B2 * | 7/2021 | Ma | G06N 3/065 |
| 2017/0337466 A1 | 11/2017 | Bayat | |
| 2020/0349422 A1 * | 11/2020 | Tran | G11C 11/5642 |
| 2020/0411065 A1 | 12/2020 | Choi et al. | |

FOREIGN PATENT DOCUMENTS

| | | |
|---|---|---|
| CN | 110782027 A | 2/2020 |
| TW | 1765456 B | 5/2022 |
| TW | 202343311 A | 11/2023 |

OTHER PUBLICATIONS

PCT Search Report and Written Opinion mailed on Aug. 14, 2024 corresponding to the related PCT Patent Application No. PCT/US2024/016783.

(Continued)

*Primary Examiner* — Khai M Nguyen
(74) *Attorney, Agent, or Firm* — Vedder Price P.C.

(57) ABSTRACT

In one example, a system comprises a vector-by-matrix multiplication array comprising an array of non-volatile memory cells arranged in rows and columns; and a sigma-delta analog-to-digital converter to receive a current from a column of the vector-by-matrix multiplication array and to generate a digital output in response to the current.

13 Claims, 49 Drawing Sheets

Sigma-Delta ADC
3700

(56) References Cited

OTHER PUBLICATIONS

Ortmanns, M. et al, "Clock Jitter Insensitive Continuous-time / spl Sigma // Delta / Modulators," Electronics, Circuits and Systems, 2001, p. 1049, Sep. 2, 2001, XP031461911, ISBN: 978-0-7803-7057-9, the 8$^{th}$ IEEE International Conference on Sep. 2-5, 2001.

Machine translation of Search Report from the Taiwan Patent Office, Mar. 27, 2025, filed under Taiwan Application No. 113134170, 1 page.

Machine translation of Office Action from Taiwan Patent Office, filed under Taiwan Application No. 113134170, 7 pages.

* cited by examiner

Memory Cell
210

Memory Cell
310

Memory Cell
410

Figure 16:
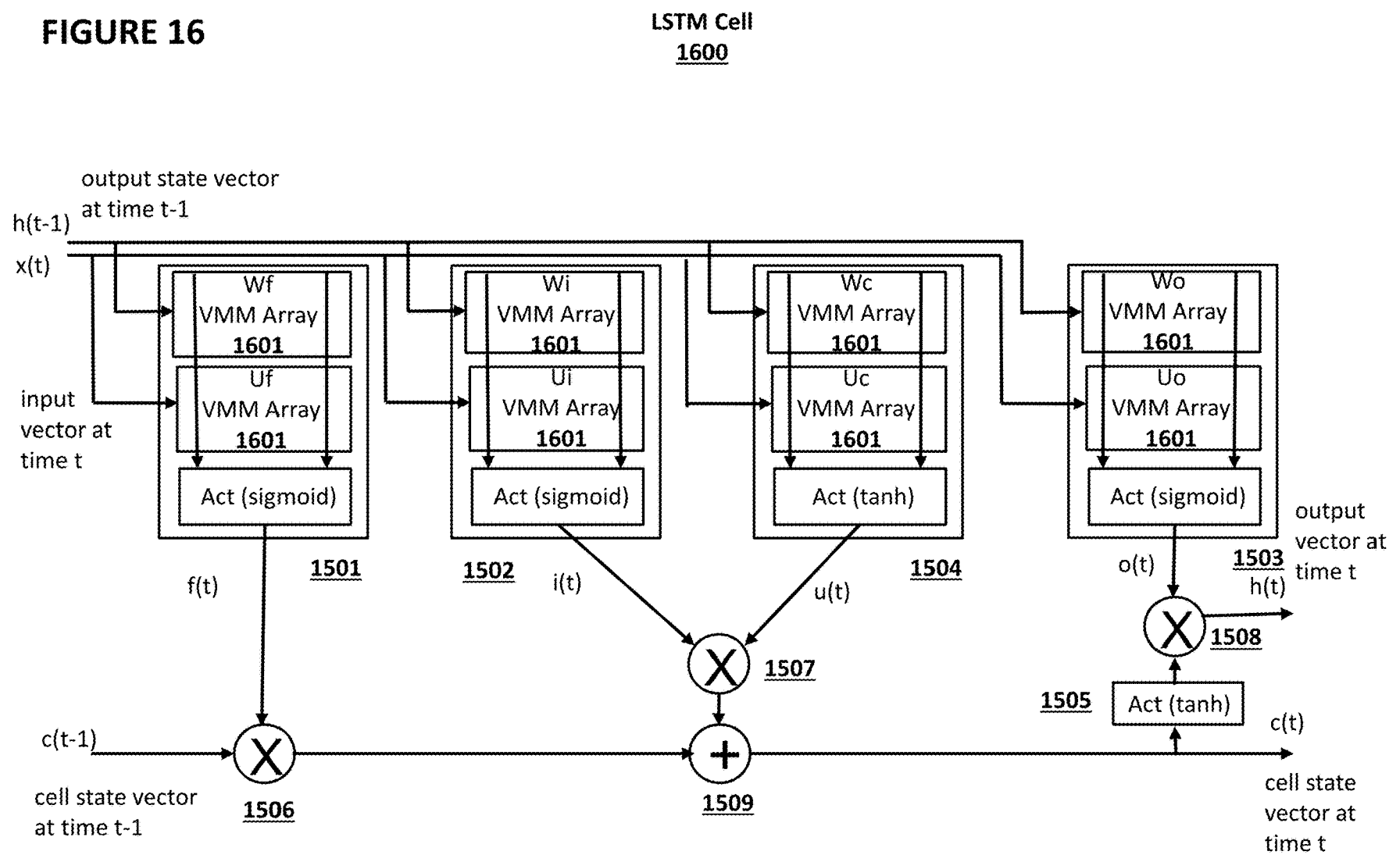

LSTM Cell
1600 output state vector
at time t-1
h(t-1)
x(t)

input
vector at
time t c(t-1)

cell state vector
at time t-1

Wf
VMM Array
1601

Uf
VMM Array
1601

Act (sigmoid)

1501 f(t)

Wi
VMM Array
1601

Ui
VMM Array
1601

Act (sigmoid)

1502 i(t)

Wc
VMM Array
1601

Uc
VMM Array
1601

Act (tanh)

1504 u(t)

Wo
VMM Array
1601

Uo
VMM Array
1601

Act (sigmoid)

1503 o(t)

⊗ 1506

⊗ 1507

⊕ 1509

⊗ 1508

Act (tanh)

1505 c(t)

cell state
vector at
time t h(t)

output
vector at
time t

FIGURE 17

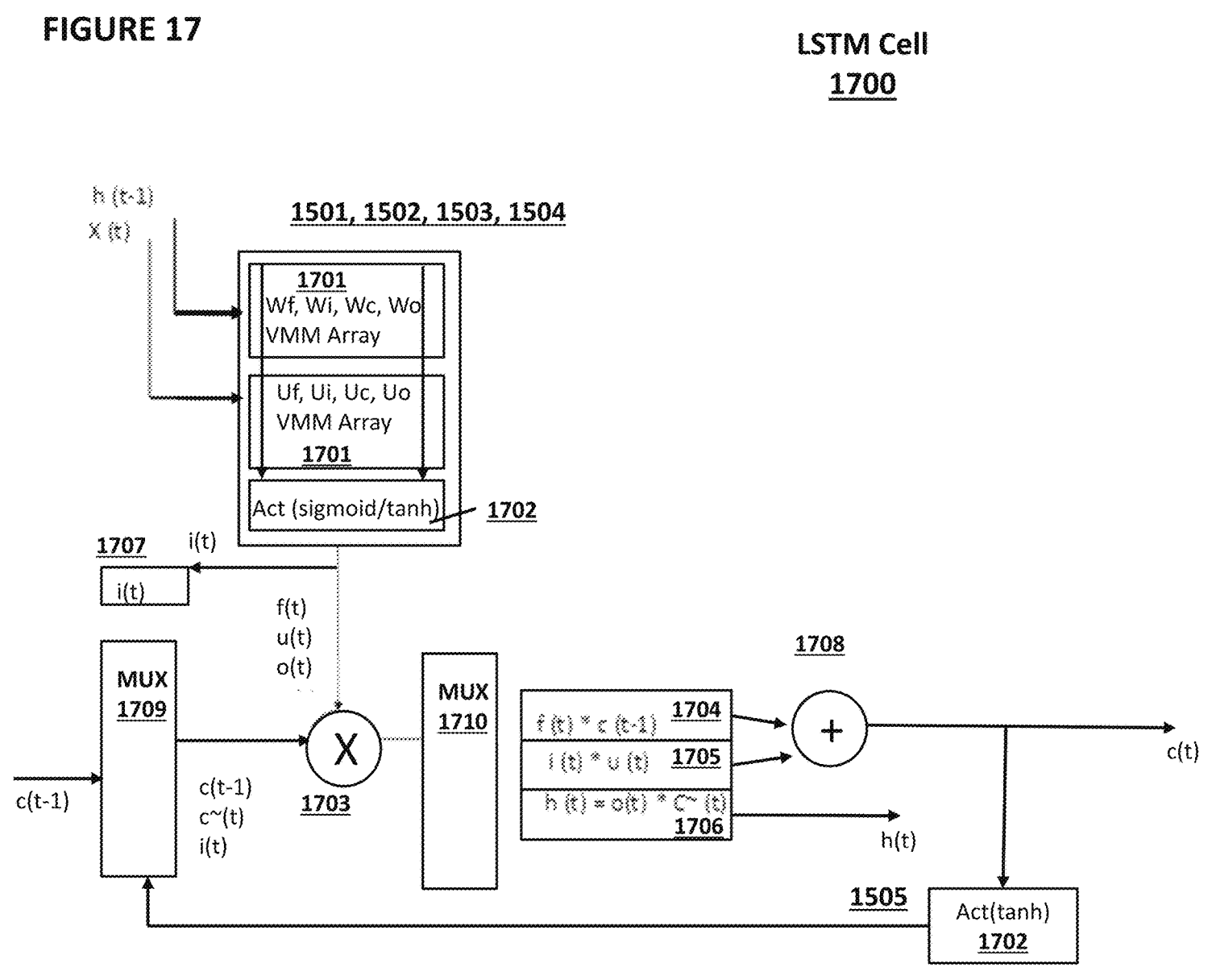

LSTM Cell
1700

1501, 1502, 1503, 1504

1701
Wf, Wi, Wc, Wo
VMM Array

Uf, Ui, Uc, Uo
VMM Array
1701

Act (sigmoid/tanh)
1702 h (t-1)

x (t)

f(t)
u(t)
o(t)

i(t)

1707
i(t)

X
1703

MUX
1709 c(t-1)
c~(t)
i(t)

c(t-1)

MUX
1710 f (t) * c (t-1)
1704 i (t) * u (t)
1705 h (t) = o(t) * C~(t)
1706

+
1708 h(t)

c(t)

Act(tanh)
1702

VMM System
3300

Output Circuit 3500

FIGURE 38

Sigma-Delta ADC
3800

DOUT [n:1]

EN, CLK

SM
3802

CLK_REFB

CLK_REF

3801

VREF

VDD

3804

3805

BL

3803

3811

VMM
Array
3401

Sigma-Delta ADC
3900

CFG_IREF

CLK_REF

DOUT
[n:1]

SM
3902

EN,
CLK

3901

VREF

IREFV
3904

BL

3903

3911

VMM
Array
3401

FIGURE 39

Sigma-Delta ADC
4100

Sigma-Delta ADC
4300

Waveforms
4400

VMM array 3401 draws a current I1

CLK

COMP_OUT
CLK_REF

VREF
VBL

Waveforms
4410

VMM array 3401 draws a current I1/2

CLK

COMP_OUT
CLK_REF

VREF
VBL

Graph
4500

V_BL vs. I_BL

Graph
4600

VBL v. IBL for different values of Qref

Graph
4700

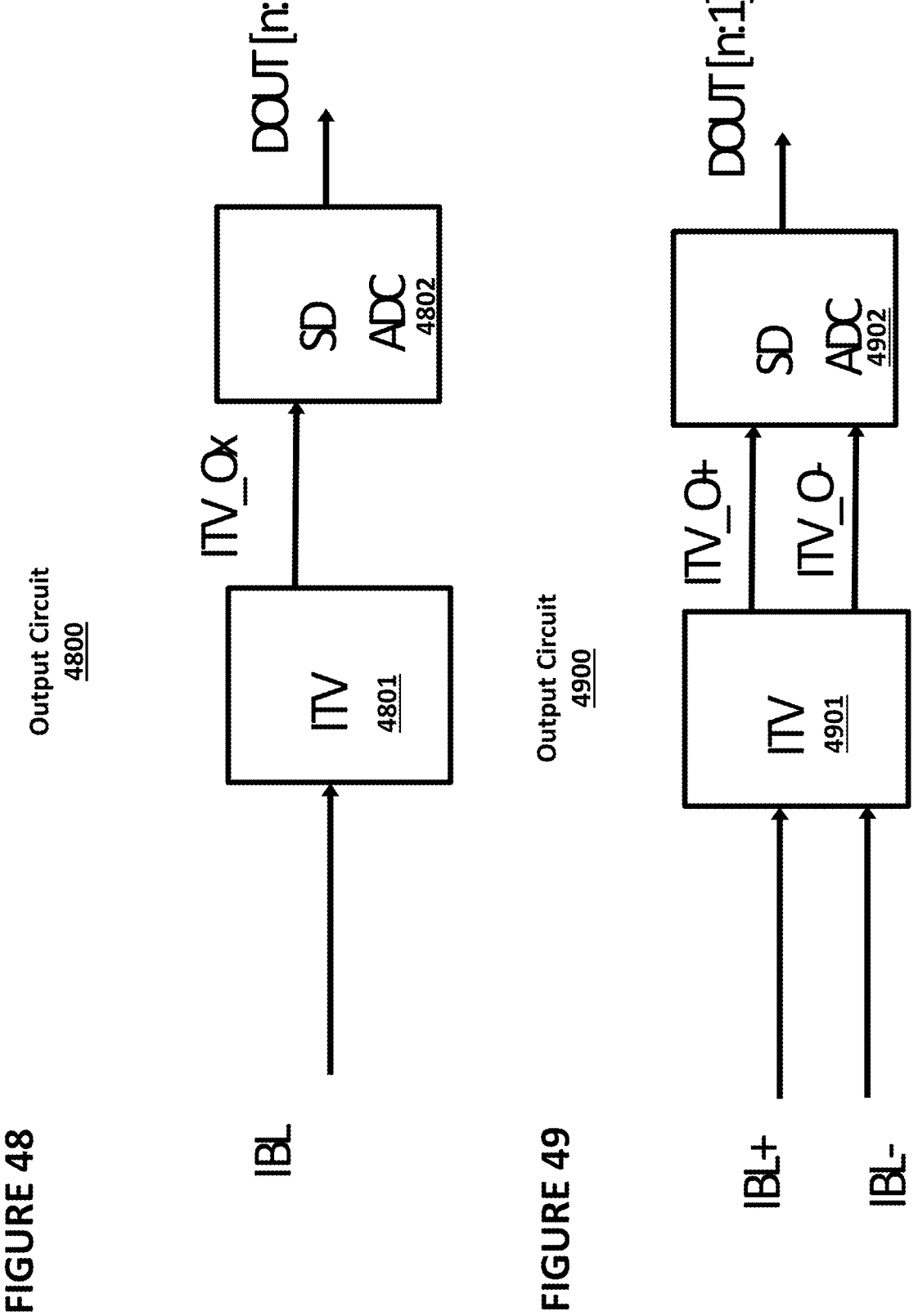

SIGMA-DELTA ANALOG-TO-DIGITAL CONVERTER TO GENERATE DIGITAL OUTPUT FROM VECTOR-BY-MATRIX MULTIPLICATION ARRAY

PRIORITY CLAIM

This application claims priority to U.S. Provisional Patent Application No. 63/601,049, filed Nov. 20, 2023, titled "Output Circuit for a Vector-by-Matrix Multiplication Array," which is incorporated by reference.

FIELD OF THE INVENTION

Numerous examples are disclosed of a Sigma-Delta analog-to-digital converter to generate a digital output from a vector-by-matrix multiplication array and associated methods.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. Patent Application Publication 2017/0337466A1, which is incorporated by reference. The non-volatile memory arrays operate as an analog neural memory and comprise non-volatile memory cells arranged in rows and columns. The neural network includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells store a weight value corresponding to a number of electrons on the floating gate. The plurality of memory cells multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 210 for performing read, erase, and program operations:

TABLE NO. 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO. 2

| Operation of Flash Memory Cell 310 of FIG. 3 | | | | |
|---|---|---|---|---|
| | WL/SG | BL | CG | EG | SL |
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 0.1-1 µA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 410 for performing read, erase, and program operations:

TABLE NO. 3

| Operation of Flash Memory Cell 410 of FIG. 4 | | | |
|---|---|---|---|
| | WL/SG | BL | EG | SL |
| Read | 0.7-2.2 V | 0.6-2 V | 0-2.6 V | 0 V |
| Erase | -0.5 V/0 V | 0 V | 11.5 V | 0 V |
| Program | 1 V | 0.2-3 µA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line)

extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO. 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | -8 to -10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, and vice-versa, independently and with minimal disturbance of other memory cells. This means the cell storage is effectively analog or at the very least can store one of many discrete values (such as 16 or 64 different values), which allows for very precise and individual tuning of all the memory cells in the memory array, and which makes the memory array ideal for storing and making fine tuning adjustments to the synapsis weights of the neural network. Neural Networks Employing Non-Volatile Memory Cell Arrays FIG. 6 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships and may not correspond to physical relationships—i.e., the arrays might not be oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 removes the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tan h, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32c. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely an example and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one example, even rows are used, and in another example, odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, may be configured to operate in a sub-threshold region.

The non-volatile reference memory cells and the non-volatile memory cells described herein are biased in weak inversion (sub threshold region):

$$Ids = Io * e^{(Vg - Vth)/nVt} = w * Io * e^{(Vg)/nVt},$$

$$\text{where } w = e^{(-Vth)/nVt}$$

where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg = n * Vt * \log\left[Ids/wp * Io\right]$$

where, wp is w of a reference or peripheral memory cell.

For a memory array used as a vector matrix multiplier VMM array with the current input, the output current is:

$$Iout = wa * Io * e^{(Vg)/nVt}, \text{ namely}$$

$$Iout = (wa/wp) * Iin = W * Iin$$

$$W = e^{(Vth - Vtha)/nVt}$$

Here, wa=w of each memory cell in the memory array.

Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth = Vth0 + gamma\left(SQRT |Vsb - 2 * \varphi F| - SQRT |2 * \varphi F|\right)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids = beta * (Vgs - Vth) * Vds; beta = u * Cox * Wt/L$$

$$W = \alpha (Vgs - Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids = 1/2 * beta * (Vgs - Vth)^2; beta = u * Cox * Wt/L$$

W$\alpha$ (Vgs−Vth)$^2$, meaning weight W is proportional to (Vgs−Vth)$^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other examples for VMM array 32 of FIG. 7 are described in U.S. Pat. No. 10,748,630, which is incorporated by reference herein. As described in that application, a source-line or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1000 of FIG. 10: | | | | | | |
| --- | --- | --- | --- | --- | --- | --- |
| | WL | WL -unsel | BL | BL -unsel | SL | SL -unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| | | | | Operation of VMM Array 1100 of FIG. 11 | | |
|---|---|---|---|---|---|---|
| | WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bit lines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which can be referred to as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| | WL | WL -<br>unsel | BL | BL -<br>unsel | CG | CG -<br>unsel<br>same<br>sector | CG -<br>unsel | EG | EG -<br>unsel | SL | SL -<br>unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh<br>(1-2 V) | 4-11 V | 0-2.6 V | 0-2.6 V | 4.5-5 V | 0-2.6 V | 4.5-5 V | 0-1 V |

Operation of VMM Array 1200 of FIG. 12

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as the case may be to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bit lines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

| | WL | WL -<br>unsel | BL | BL -<br>unsel | CG | CG -unsel<br>same<br>sector | CG -<br>unsel | EG | EG -<br>unsel | SL | SL -<br>unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh<br>(1-2 V) | 4-11 V | 0-2.6 V | 0-2.6 V | 4.5-5 V | 0-2.6 V | 4.5-5 V | 0-1 V |

Operation of VMM Array 1300 of FIG. 13

FIG. 22 depicts neuron VMM array 2200, which is particularly suited for memory cells 210 as shown in FIG. 2 and is utilized as the synapses and parts of neurons between an input layer and the next layer. In VMM array 2200, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 23:
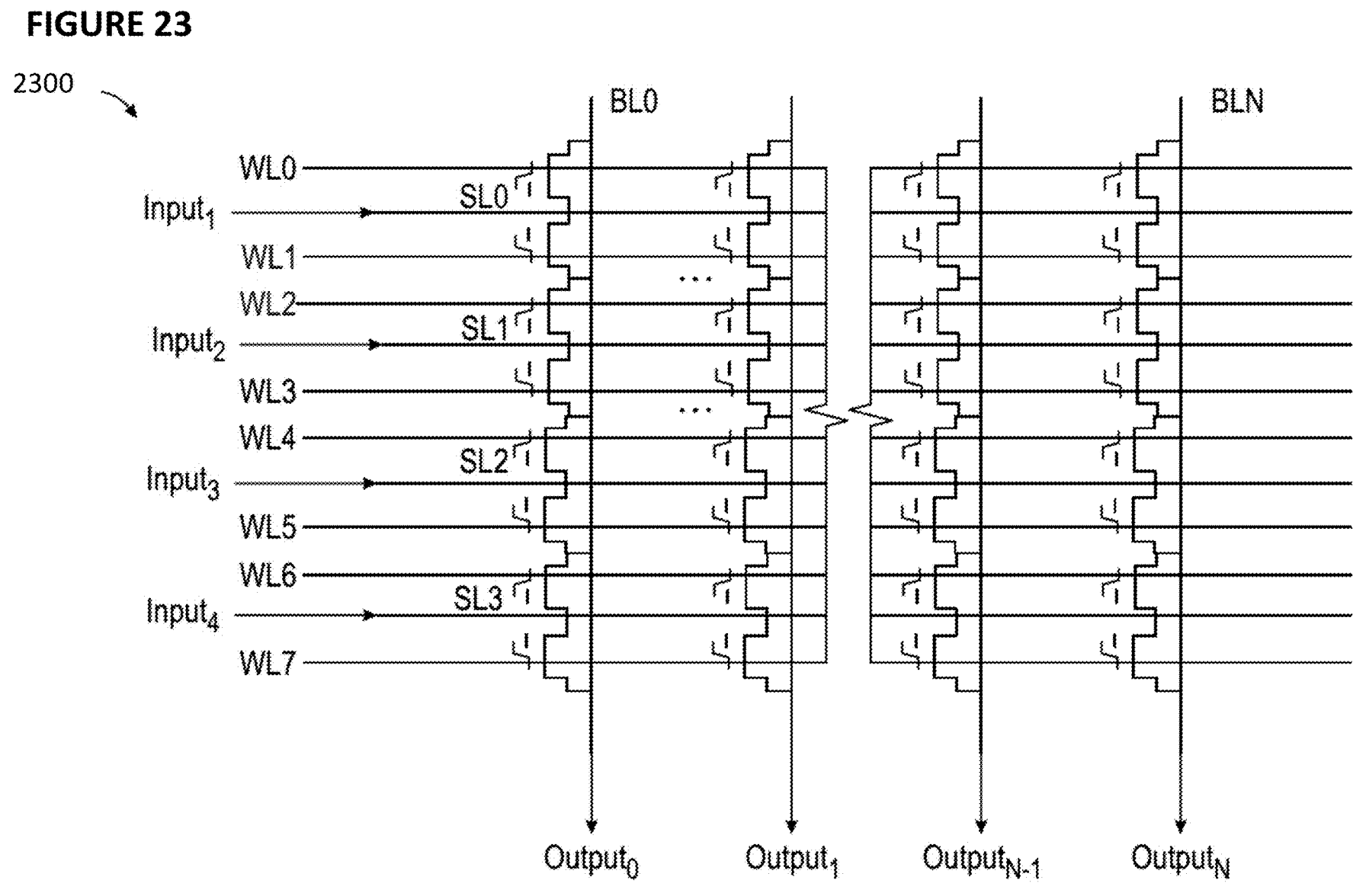

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 24:
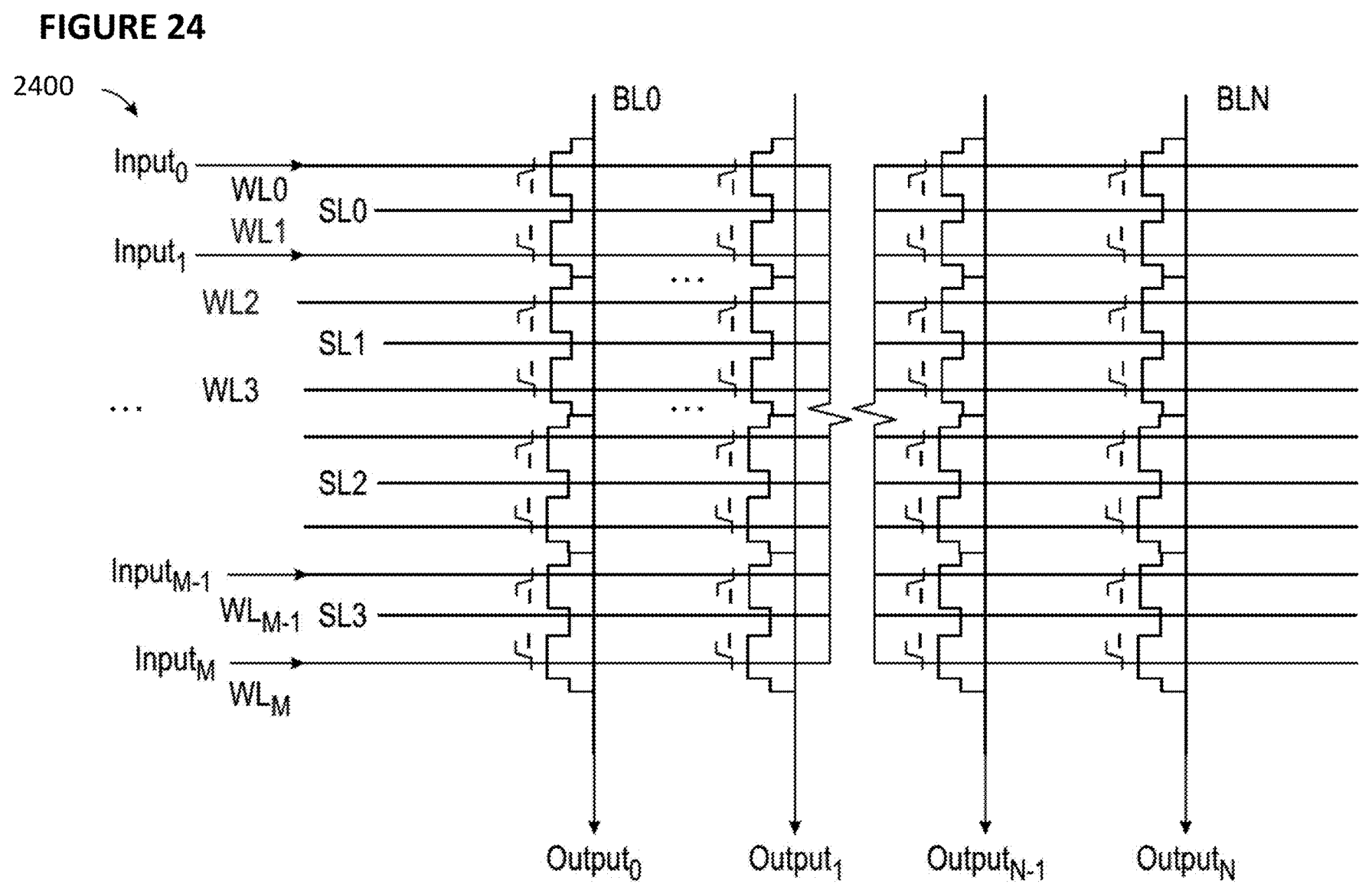

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4 and is utilized as the synapses and parts of neurons between an input layer and the next layer. In this example, the inputs $INPUT_0, \ldots, INPUT_N$ are received on the gates of bit line control gates 2701-1, 2701-2, ..., 2701-(N–1), and 2701-N, respectively, which are coupled to bit lines $BL_0, \ldots, BL_N$, respectively. Example outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SL_N$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept referred to as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

Figure 14:
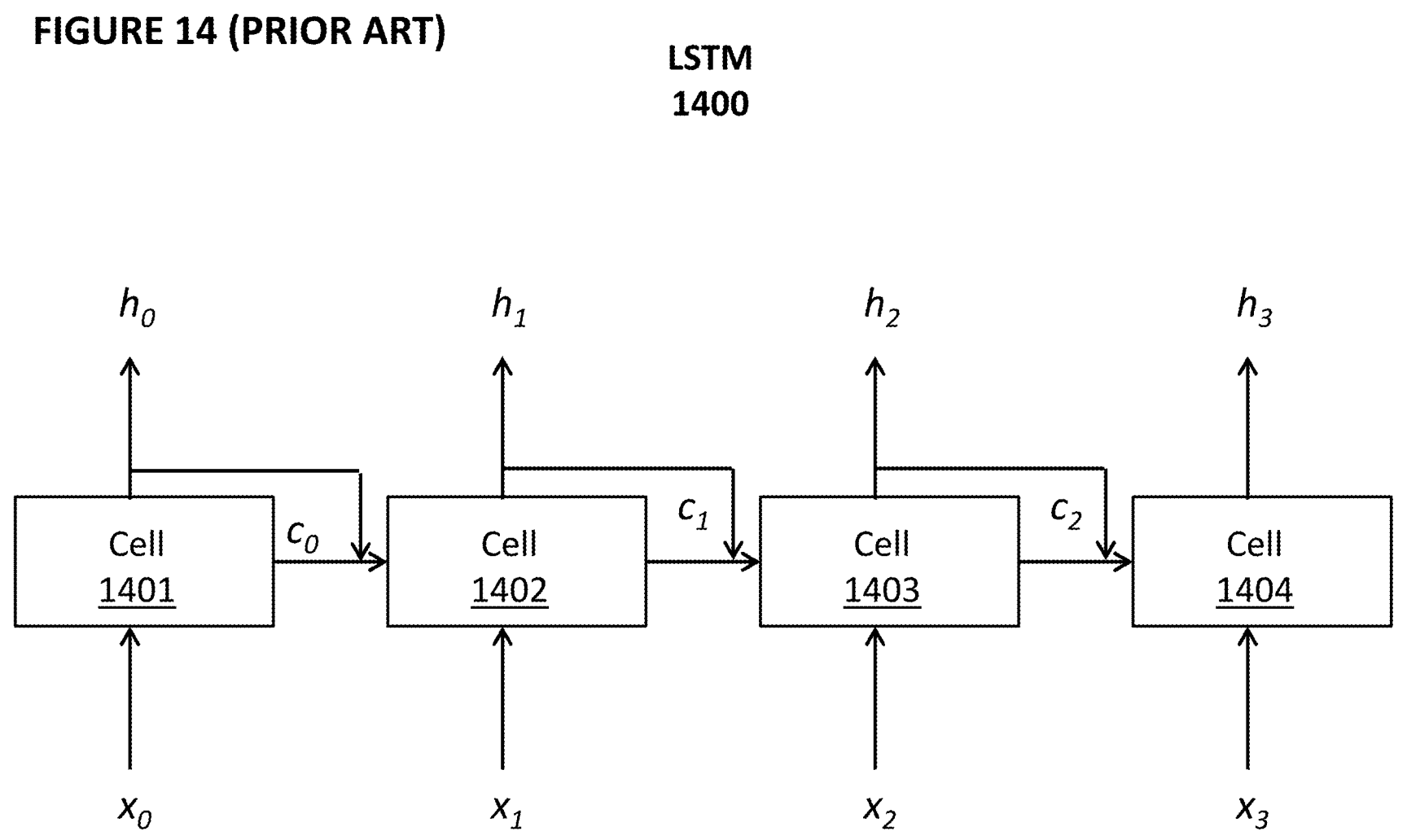

FIG. 14 depicts an example LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an example implementation of an LSTM cell 1500, which can be used for cells 1401, 1402, 1403, and 1404 in FIG. 14. LSTM cell 1500 receives input vector x(t), cell state vector c(t–1) from a preceding cell, and output vector h(t–1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tan h device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG.

17. In FIG. 17, sigmoid function devices 1501, 1502, and 1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tan h device 1505 (which comprises activation function block 1702), register 1707 to store the value i (t) when i (t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains one set of VMM arrays 1701 and activation function block 1702, which are used to represent multiple layers in the example of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which uses functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry used outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an example GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an example implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value hˆ(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains one set of VMM arrays 2101 and activation function block 2102, which are used to represent multiple layers in the example of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which uses functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry used outside of the VMM arrays themselves.

The input to the VMM arrays can be an analog level, a binary level, a pulse, a time modulated pulse, or digital bits (in this case a DAC is used to convert digital bits to appropriate input analog level) and the output can be an analog level, a binary level, a timing pulse, pulses, or digital bits (in this case an output ADC is used to convert output analog level into digital bits).

In general, for each memory cell in a VMM array, each weight W can be implemented by a single memory cell or by a differential cell or by two blend memory cells (average of 2 cells). In the differential cell case, two memory cells are used to implement a weight W as a differential weight (W=W+−W−). In the two blend memory cells, two memory cells are used to implement a weight W as an average of two cells.

FIG. 31 depicts VMM system 3100. In some examples, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W-lines, that is, bit lines connecting to memory cells implementing negative weights W−. The W-lines are interspersed among the W+θlines in an alternating fashion. The subtraction operation is performed by a summation circuit that receives current from a W+ line and a W-line, such as summation circuits 3101 and 3102. The output of a W+ line and the output of a W-line are combined together to give effectively W=W+−W− for each pair of (W+, W−) cells for all pairs of (W+, W−) lines. While the above has been described in relation to W− lines interspersed among the W+ lines in an alternating fashion, in other examples W+ lines and W− lines can be arbitrarily located anywhere in the array.

FIG. 32 depicts another example. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300, the weights, W, stored in a VMM array are stored as differential pairs, W+ (positive weight) and W−(negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate can hold one of N different values, where N is the number of different weights that can be indicated by each cell. Examples of N include 16, 32, 64, 128, and 256.

Prior art systems require significant area and involve significant latency at the output stage. For example, multiple clock cycles are used to convert analog current received from the VMM array into digital output data.

It is desirable to reduce latency at the output to increase the overall speed of operation of the system, which system represents some or all of an artificial neural network.

SUMMARY OF THE INVENTION

Numerous examples are disclosed of an output circuit and associated methods for a neural network array.

BRIEF DESCRIPTION OF THE DRAWINGS

FIG. 14 depicts a prior art long short-term memory system.

FIG. 16 depicts an example implementation of the cell of FIG. 15.

FIG. 17 depicts another example implementation of the cell of FIG. 15.

FIG. 23 depicts another example of a VMM system.

FIG. 24 depicts another example of a VMM system.

FIG. 38 depicts another sigma-delta analog-to-digital converter.

FIG. 39 depicts another sigma-delta analog-to-digital converter.

FIG. 48 depicts an output circuit.

FIG. 49 depicts an output circuit.

DETAILED DESCRIPTION OF THE INVENTION

VMM System Architecture

Figure 1:
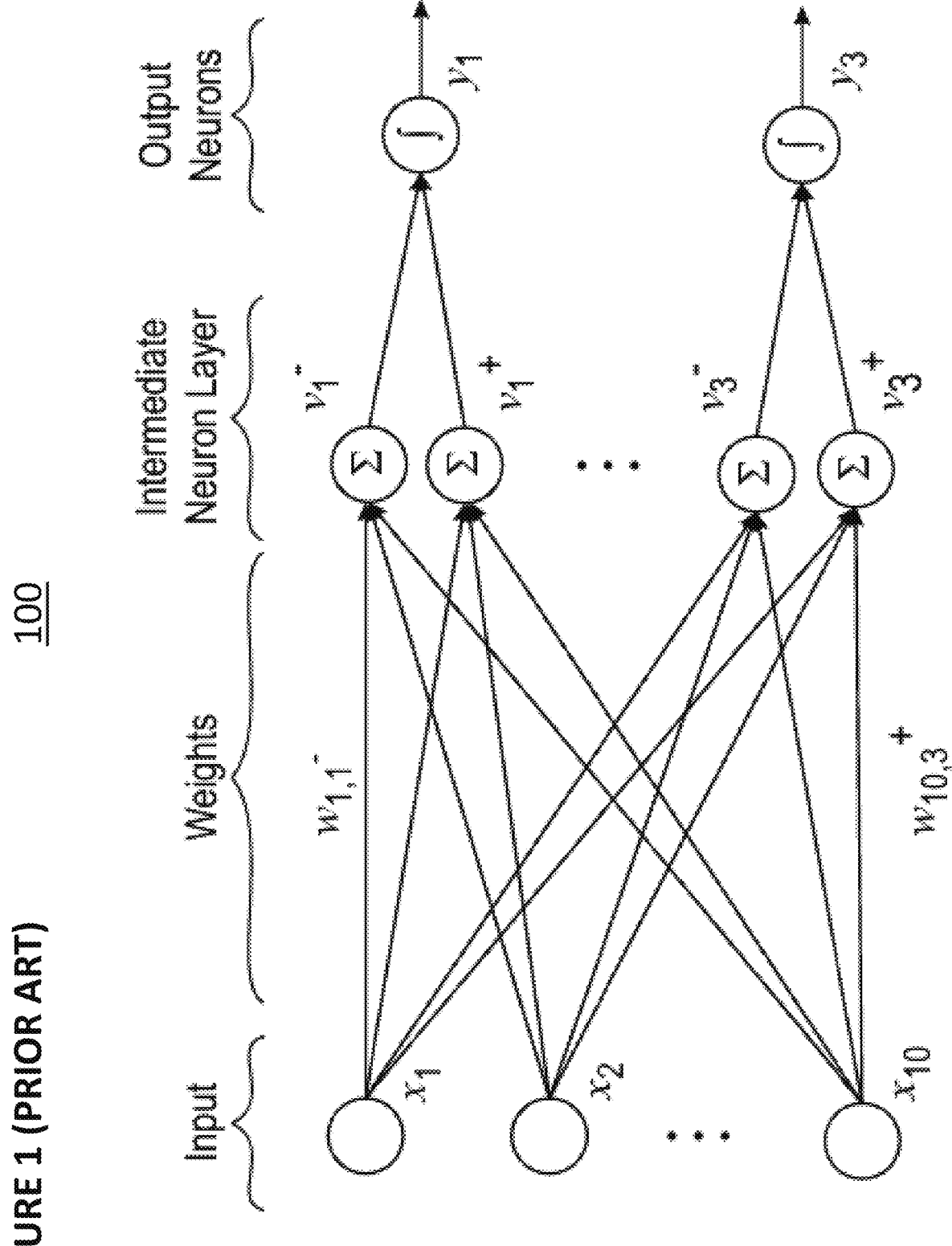
FIG. 1 is a diagram that illustrates an artificial neural network.
Figure 2:
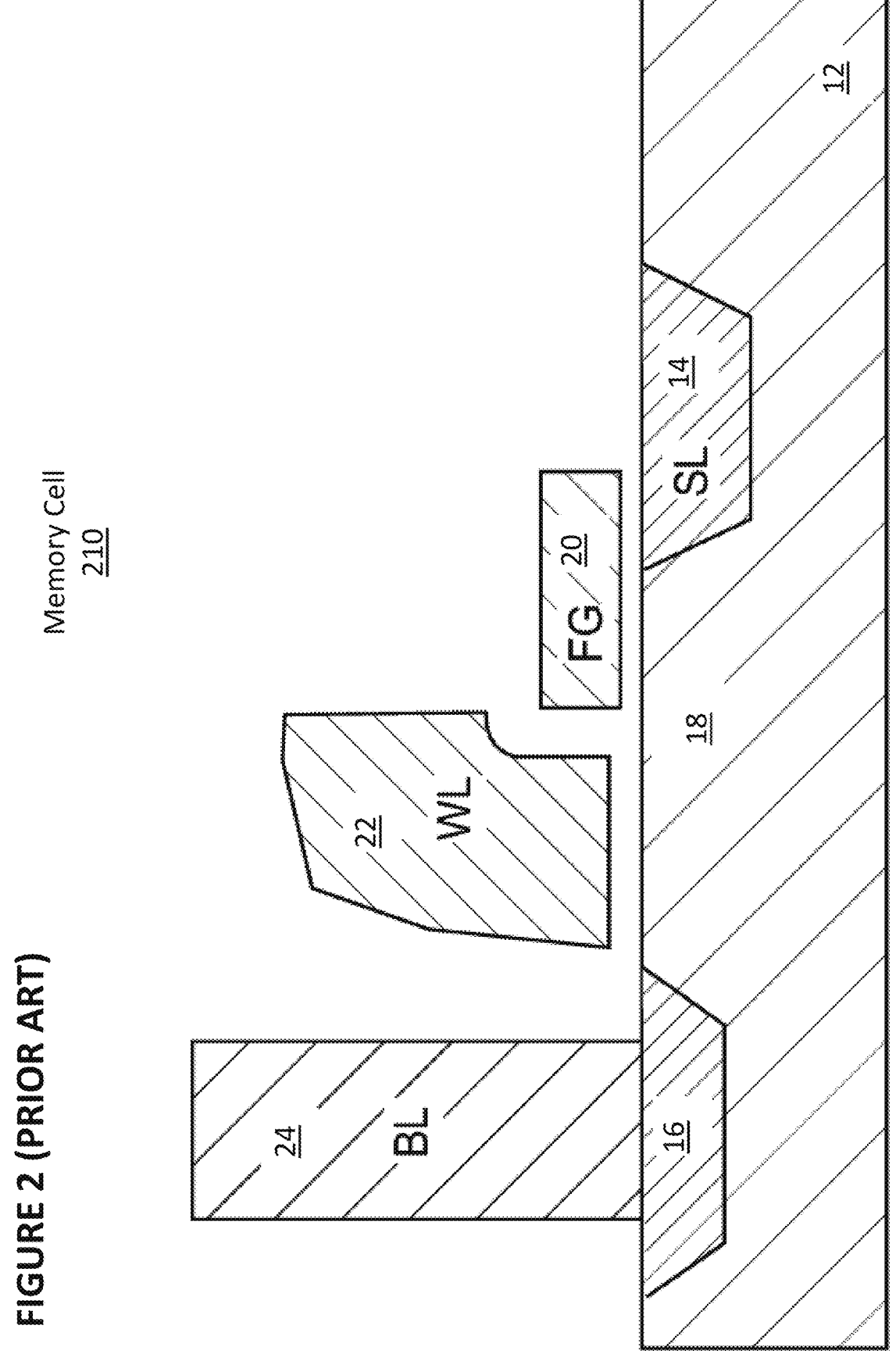
FIG. 2 depicts a prior art split gate flash memory cell.
Figure 3:
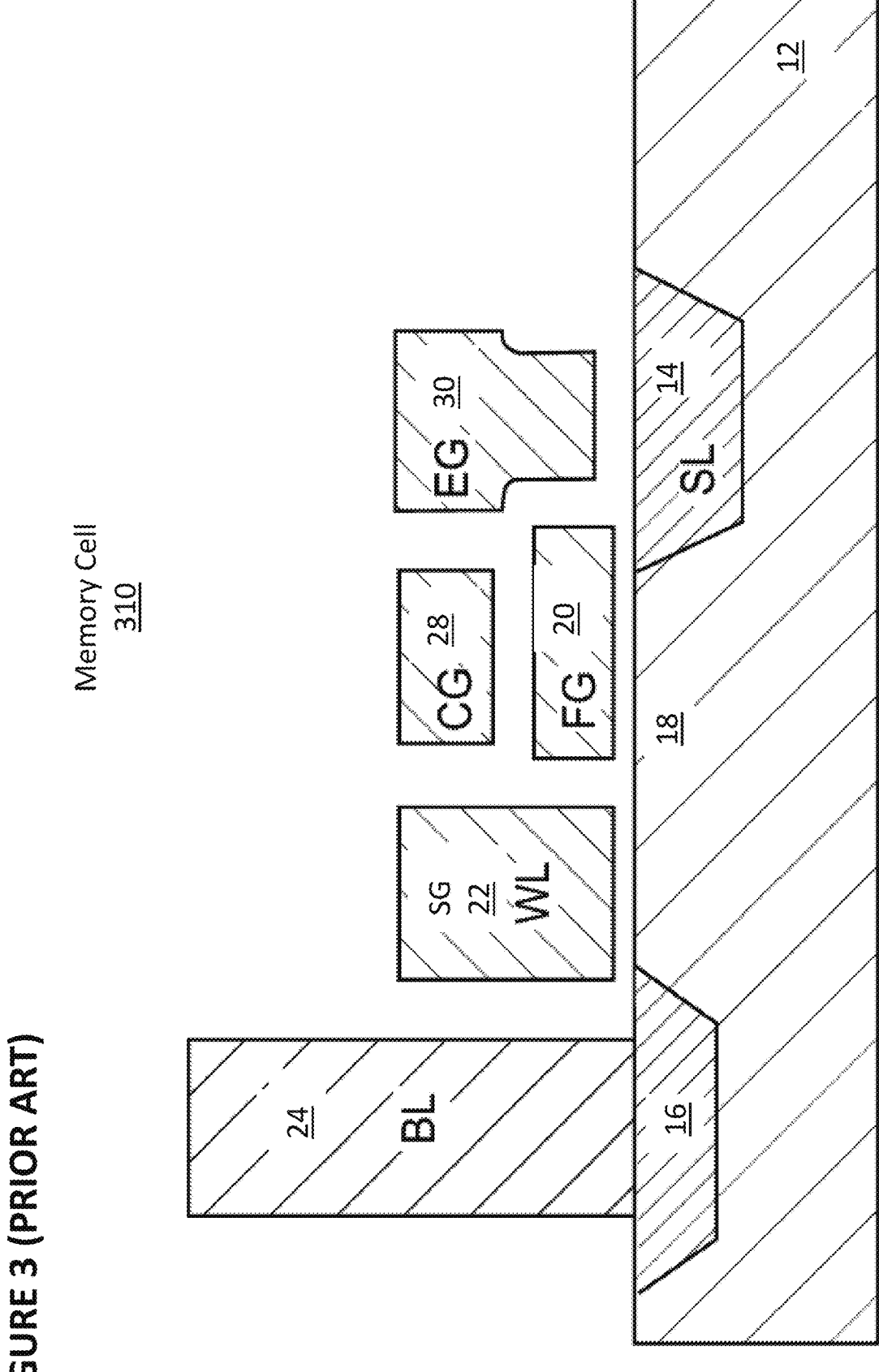
FIG. 3 depicts another prior art split gate flash memory cell.
Figure 4:
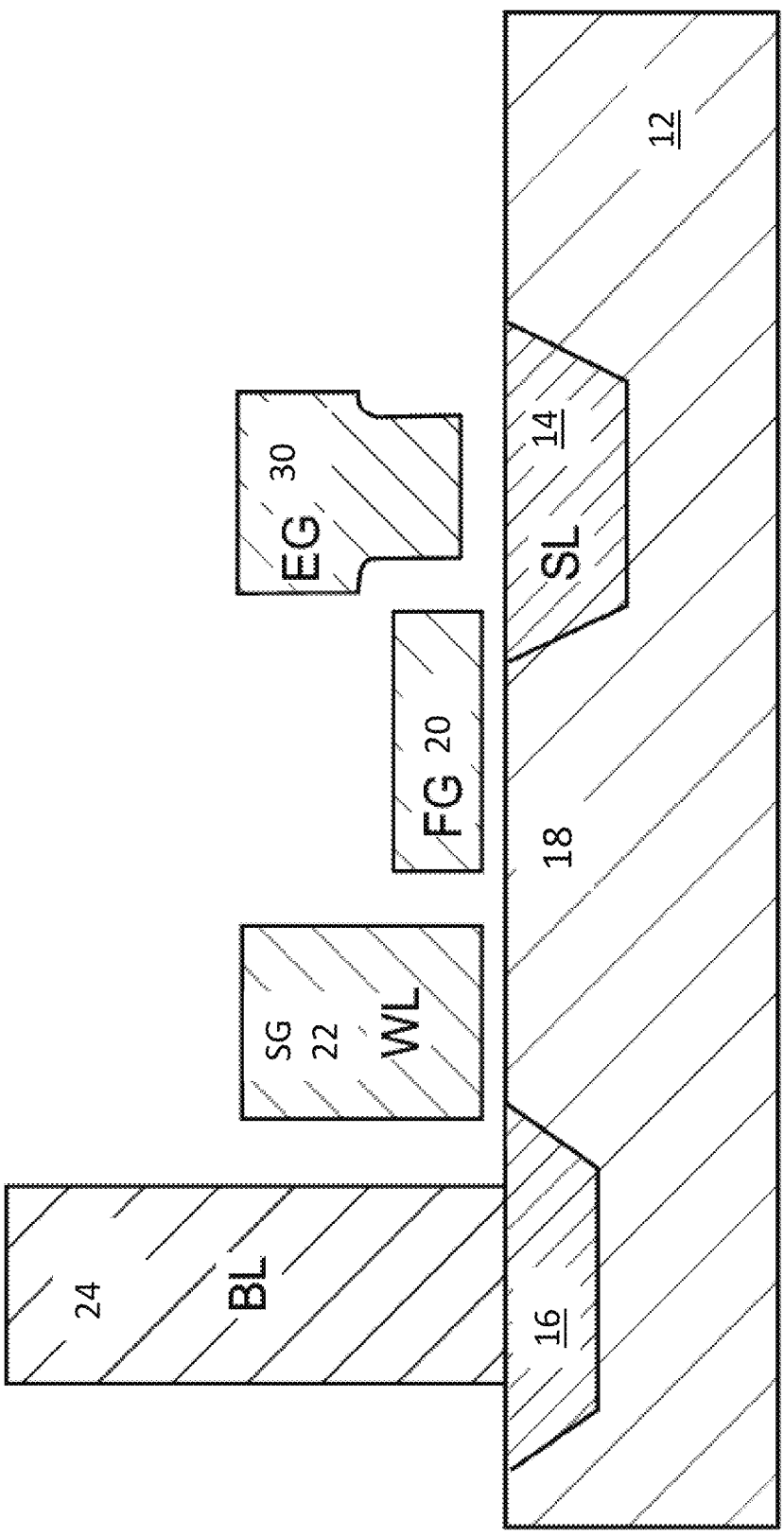
FIG. 4 depicts another prior art split gate flash memory cell.
Figure 5:
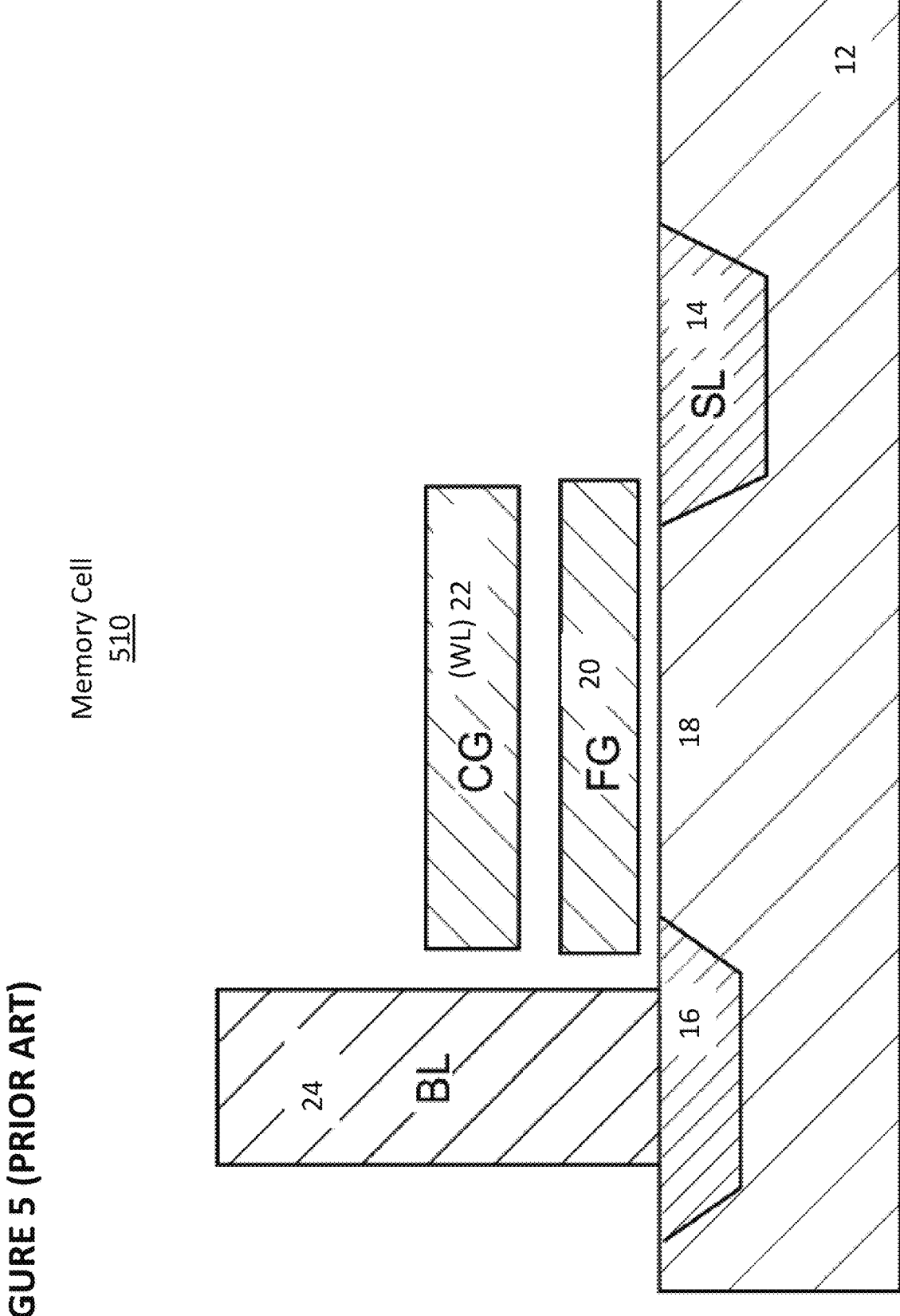
FIG. 5 depicts another prior art split gate flash memory cell.
Figure 6:
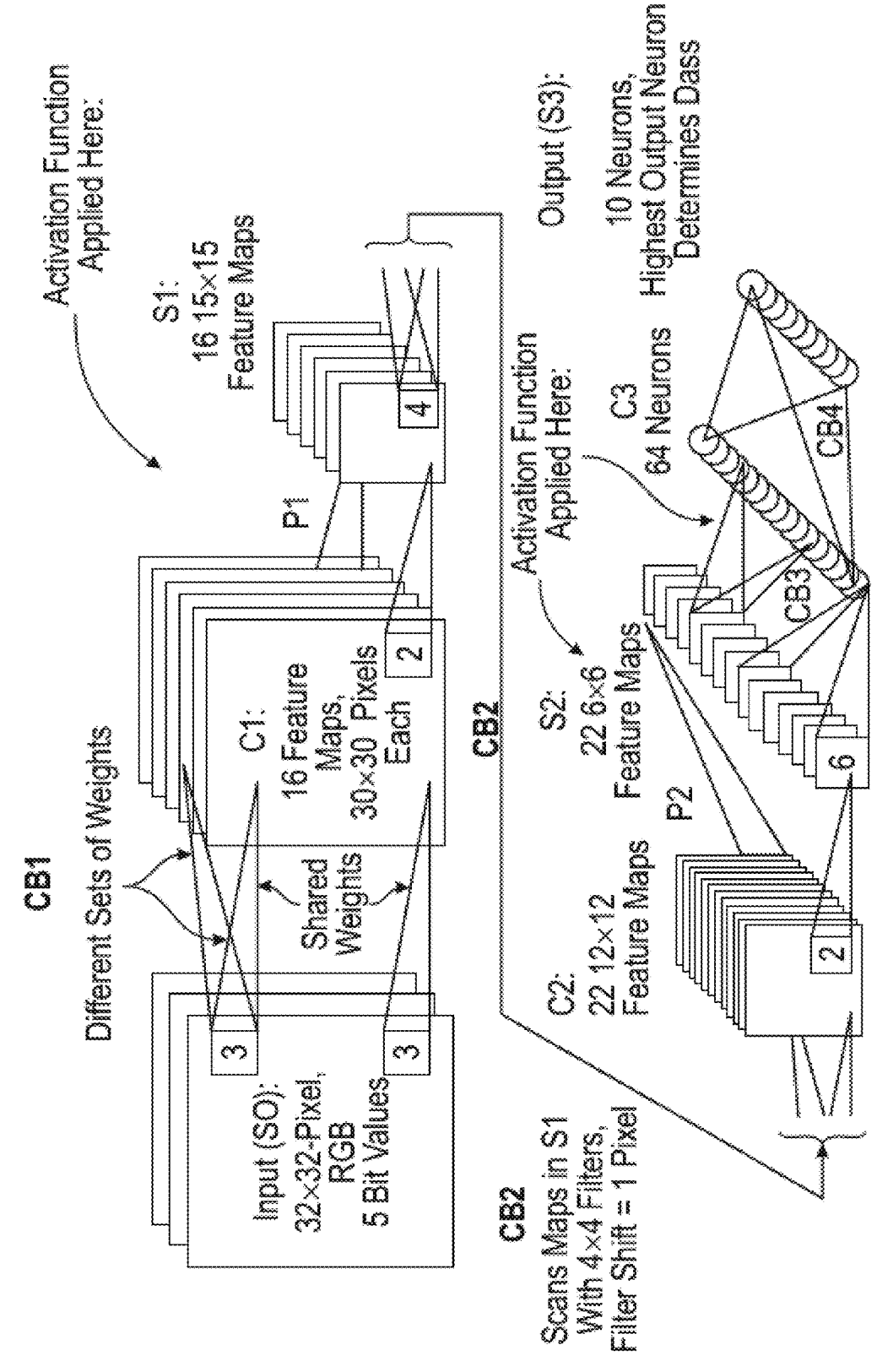
FIG. 6 is a diagram illustrating the different levels of an artificial neural network utilizing one or more non-volatile memory arrays.
Figure 7:
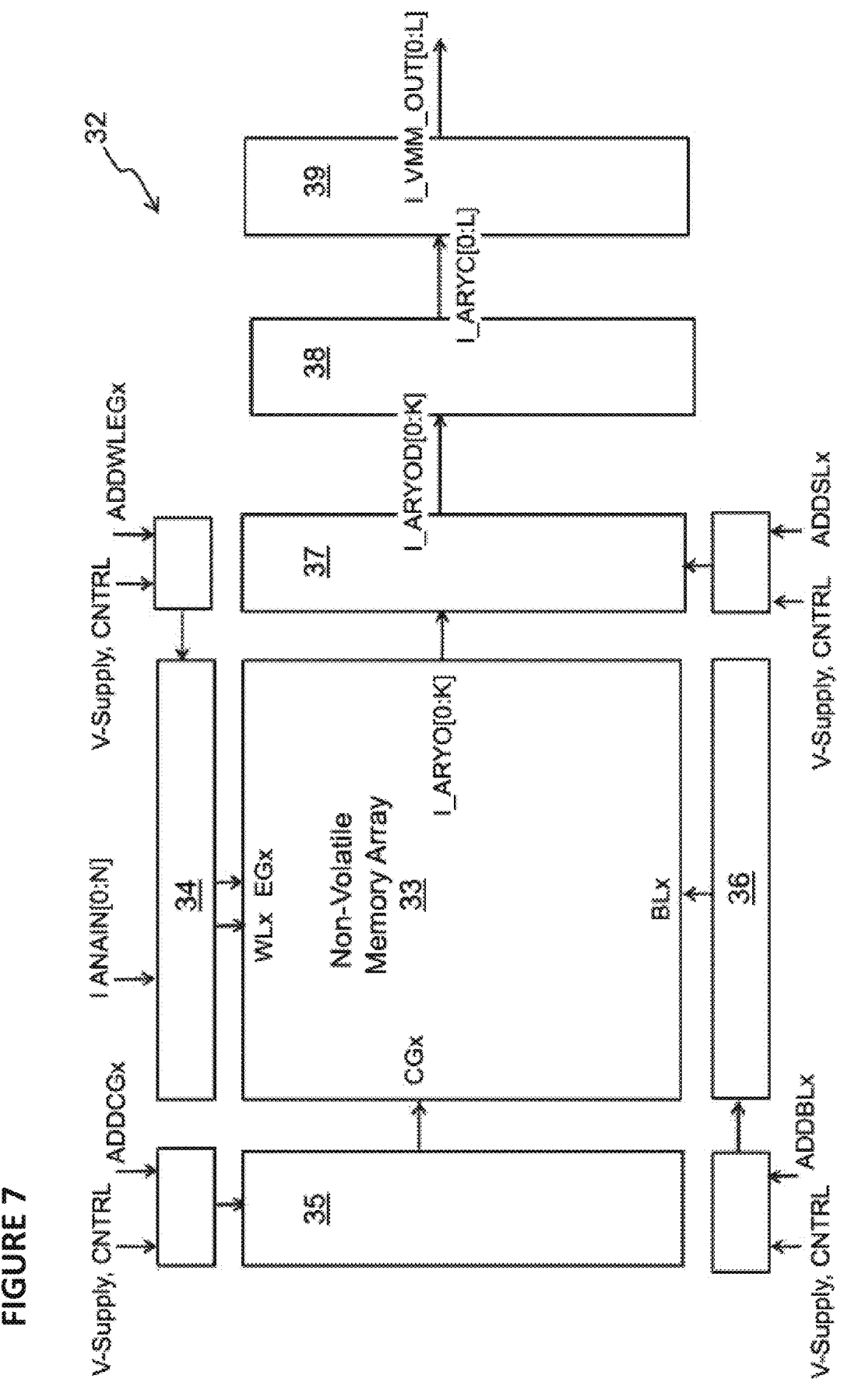
FIG. 7 is a block diagram illustrating a VMM system.
Figure 8:
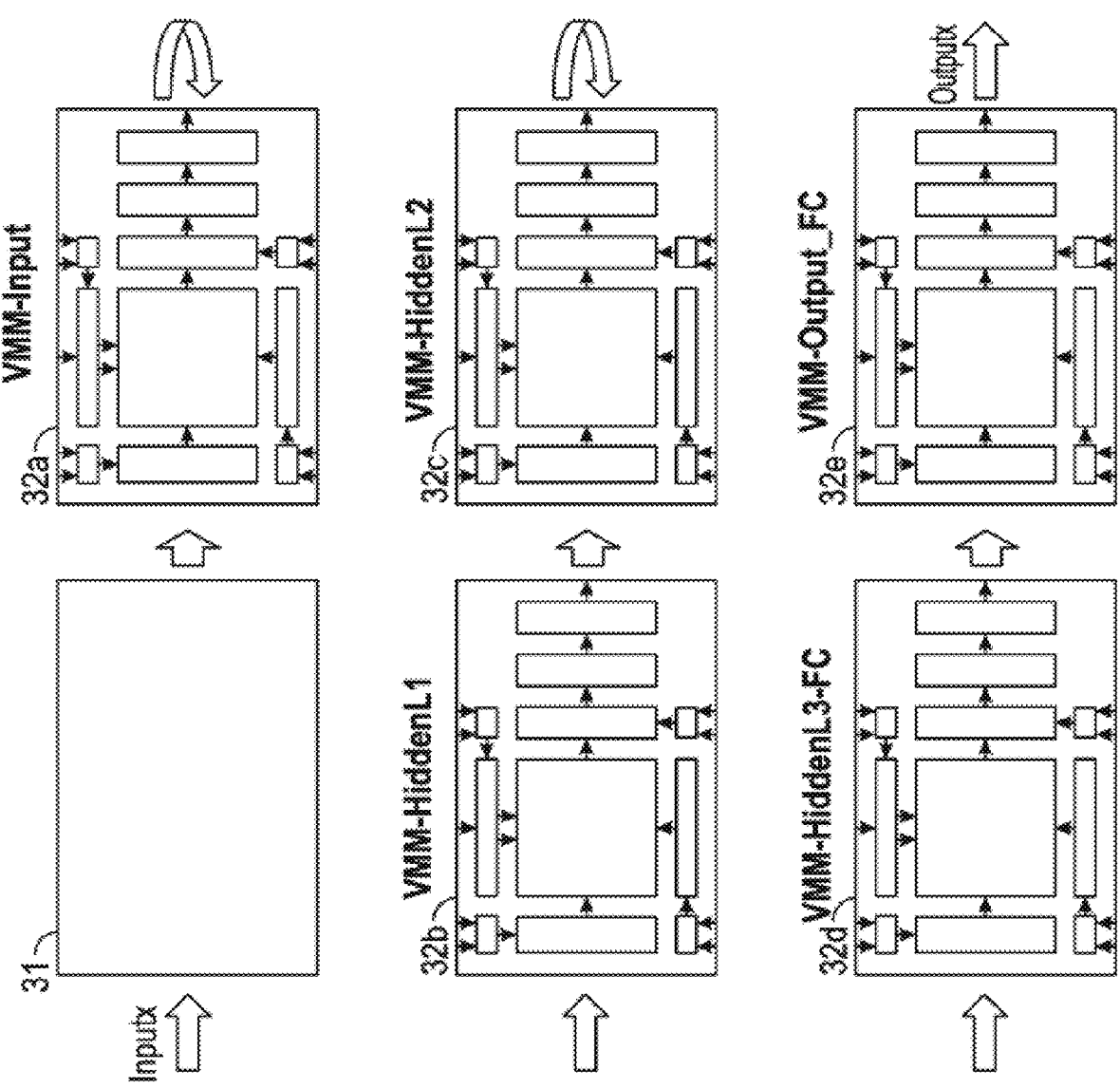
FIG. 8 is a block diagram illustrates an example artificial neural network utilizing one or more VMM systems.
Figure 9:
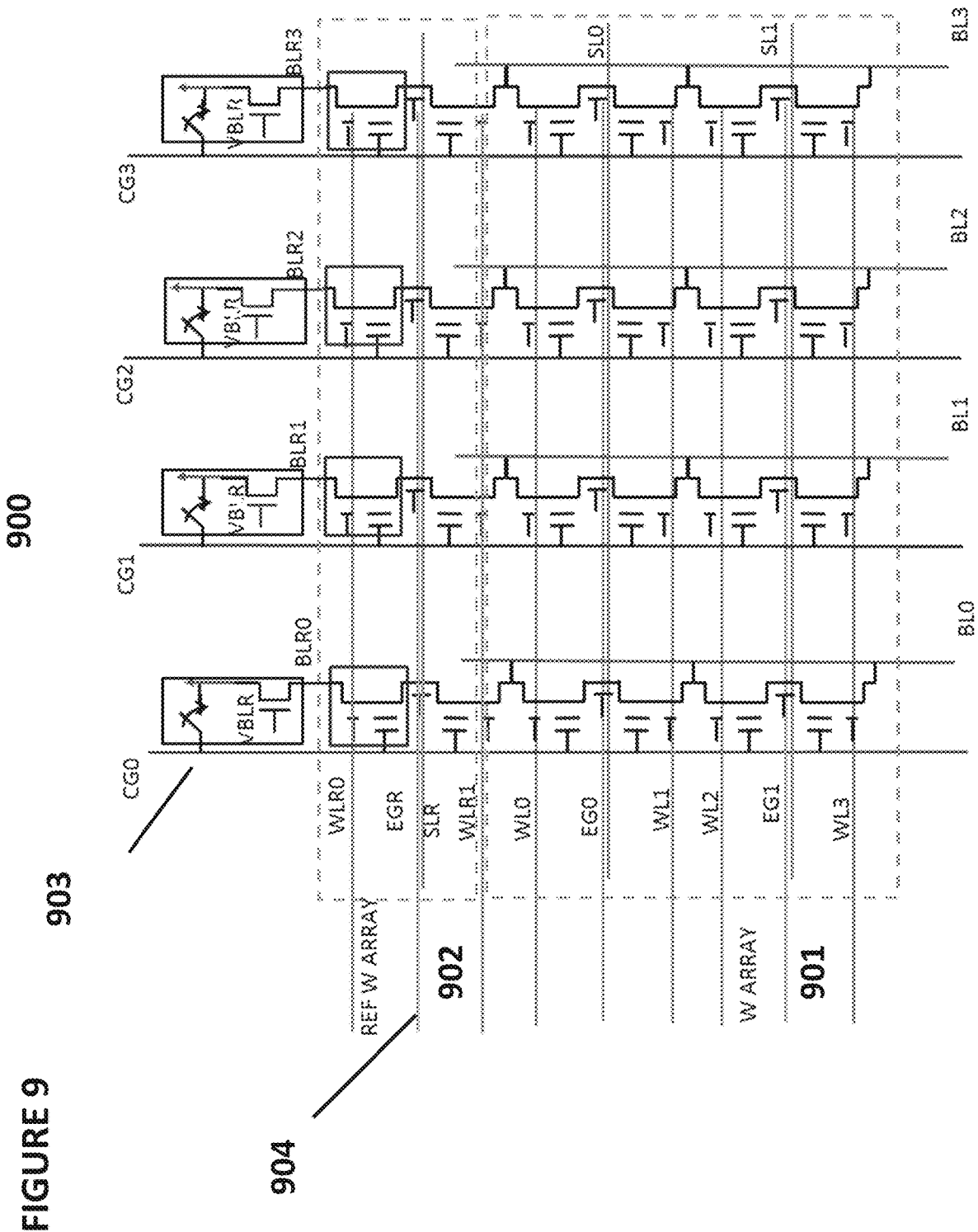
FIG. 9 depicts another example of a VMM system.
Figure 10:
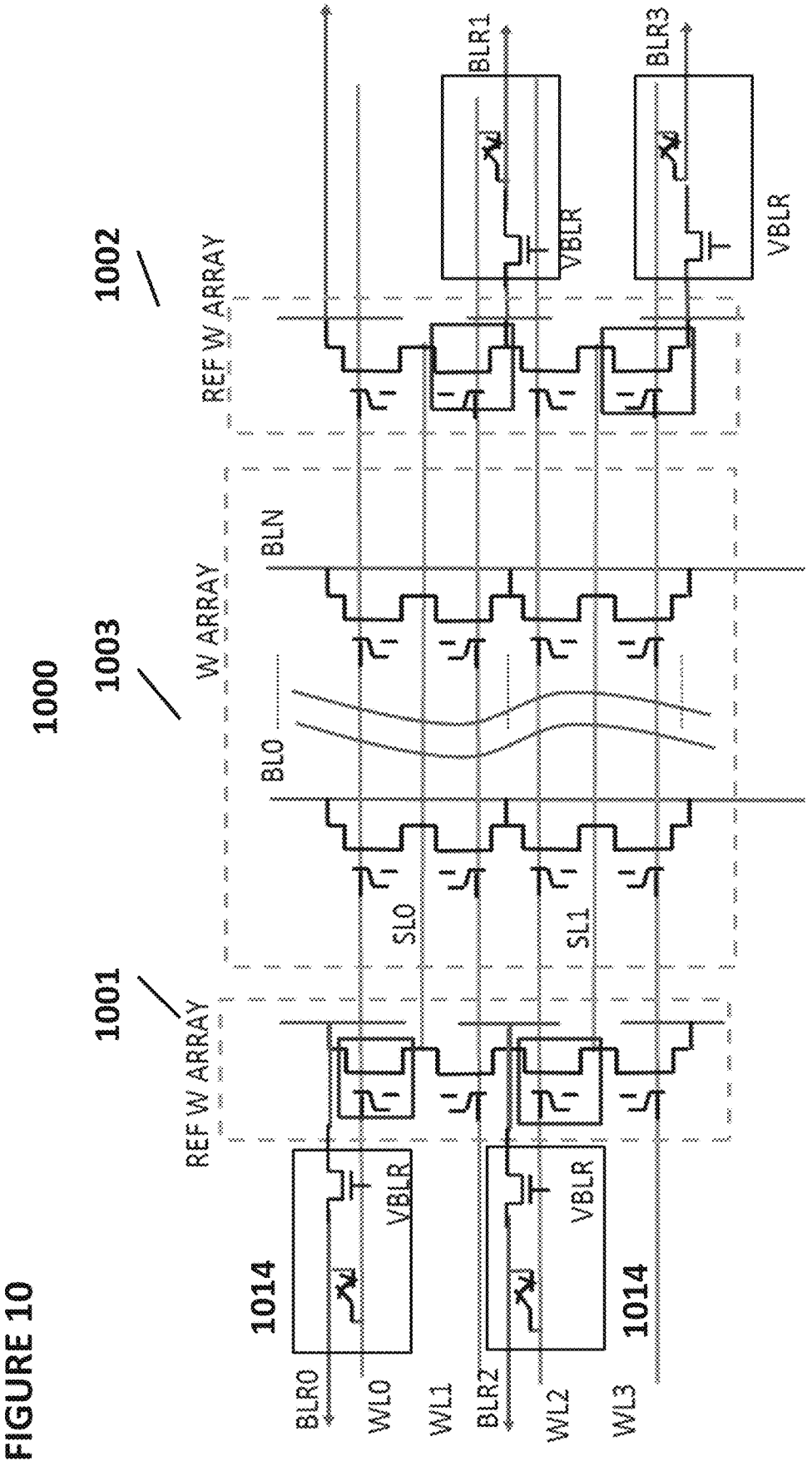
FIG. 10 depicts another example of a VMM system.
Figure 11:
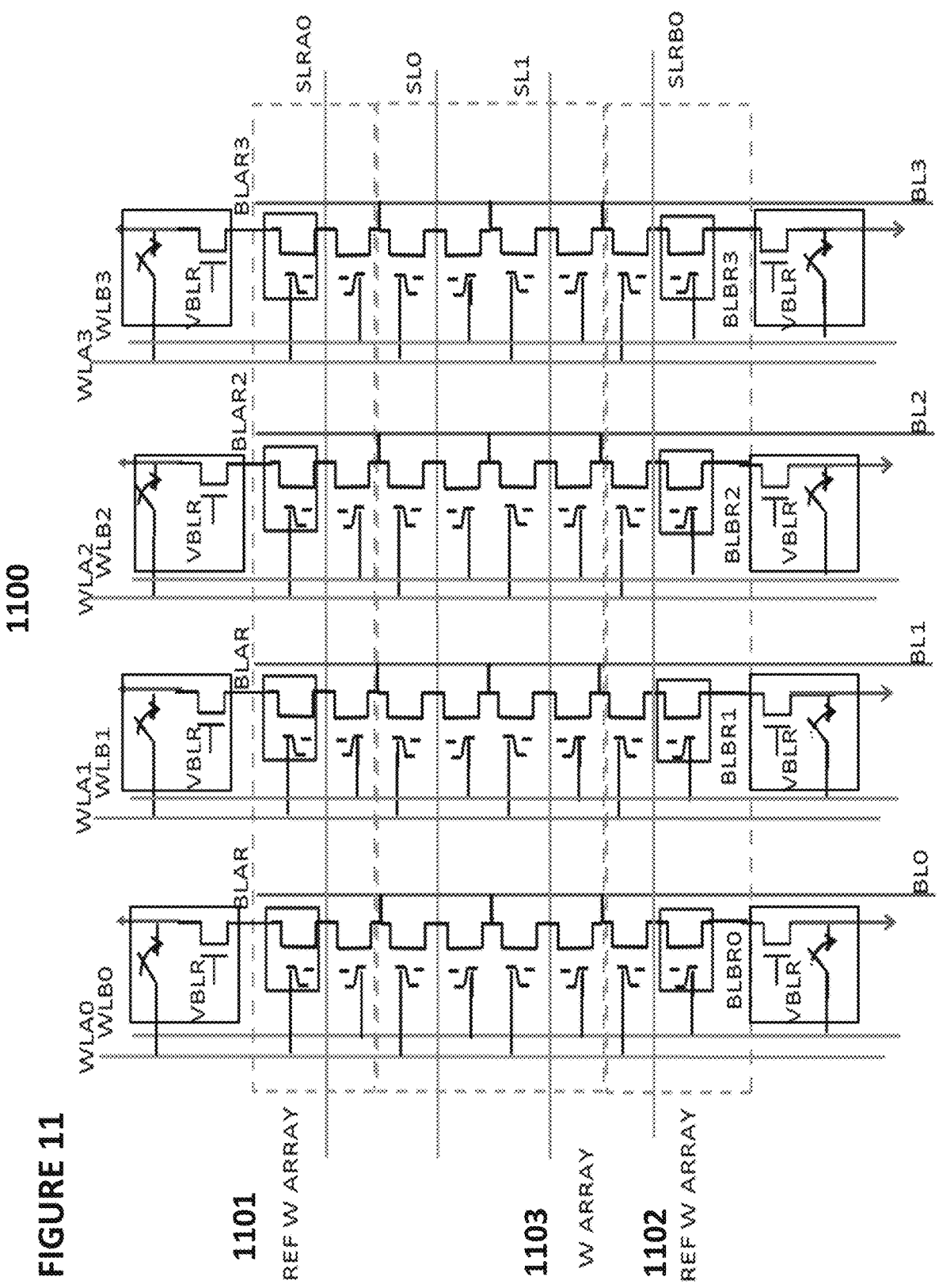
FIG. 11 depicts another example of a VMM system.
Figure 12:
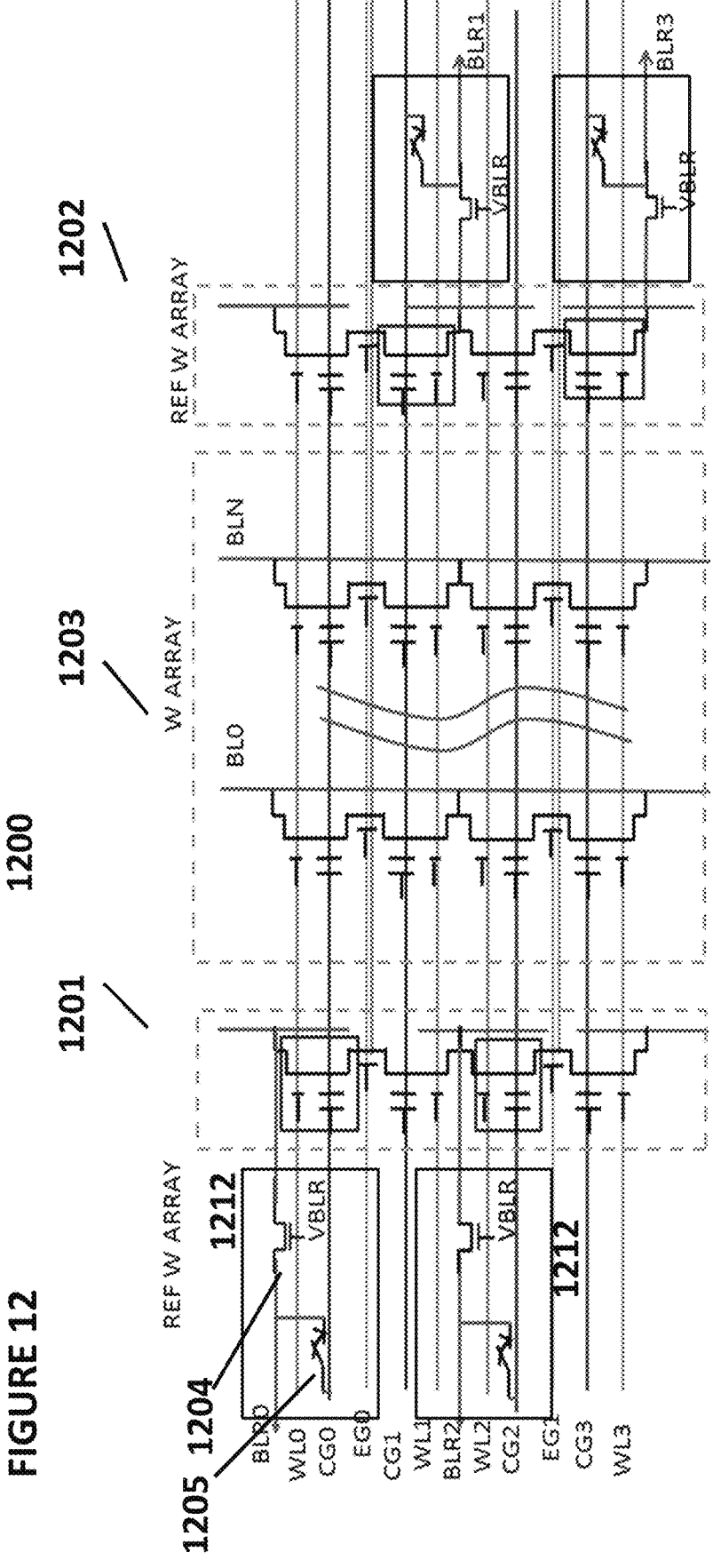
FIG. 12 depicts another example of a VMM system.
Figure 13:
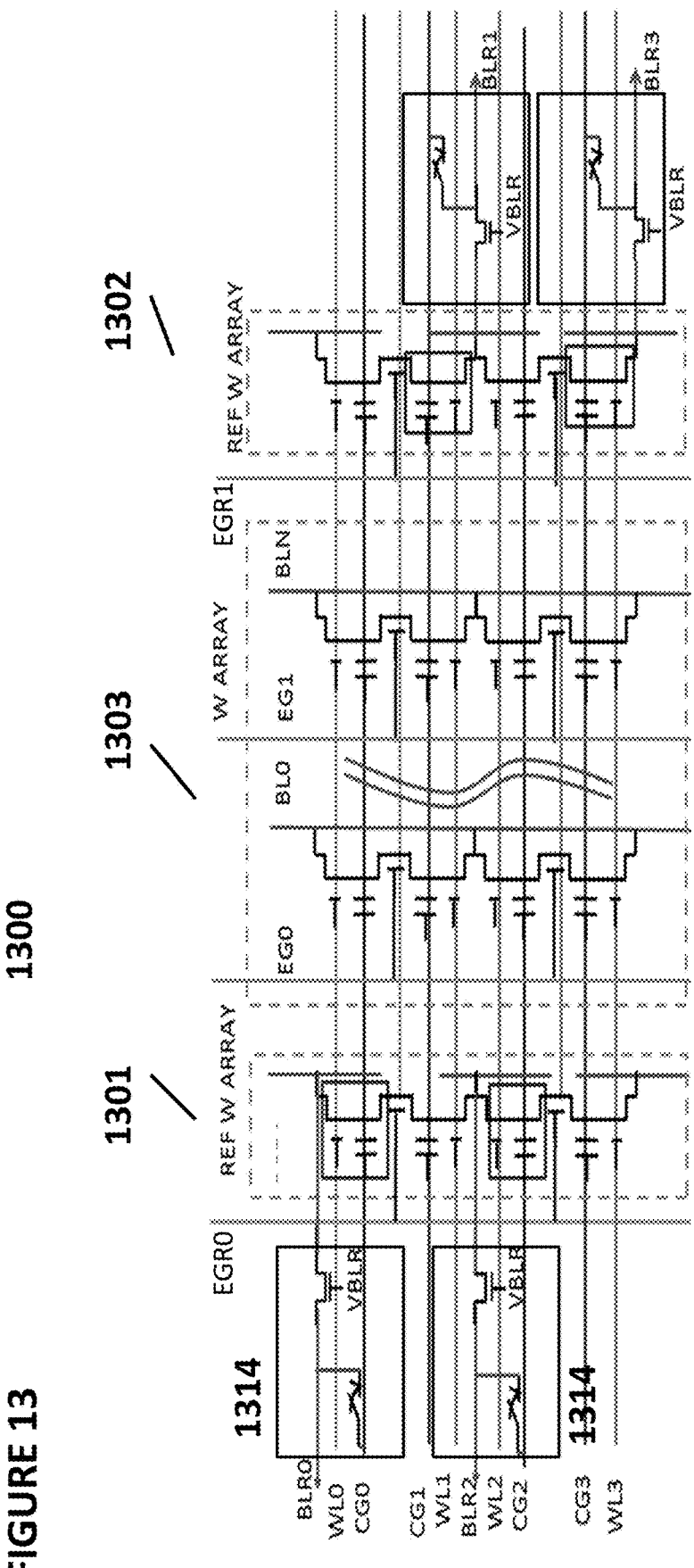
FIG. 13 depicts another example of a VMM system.
Figure 15:
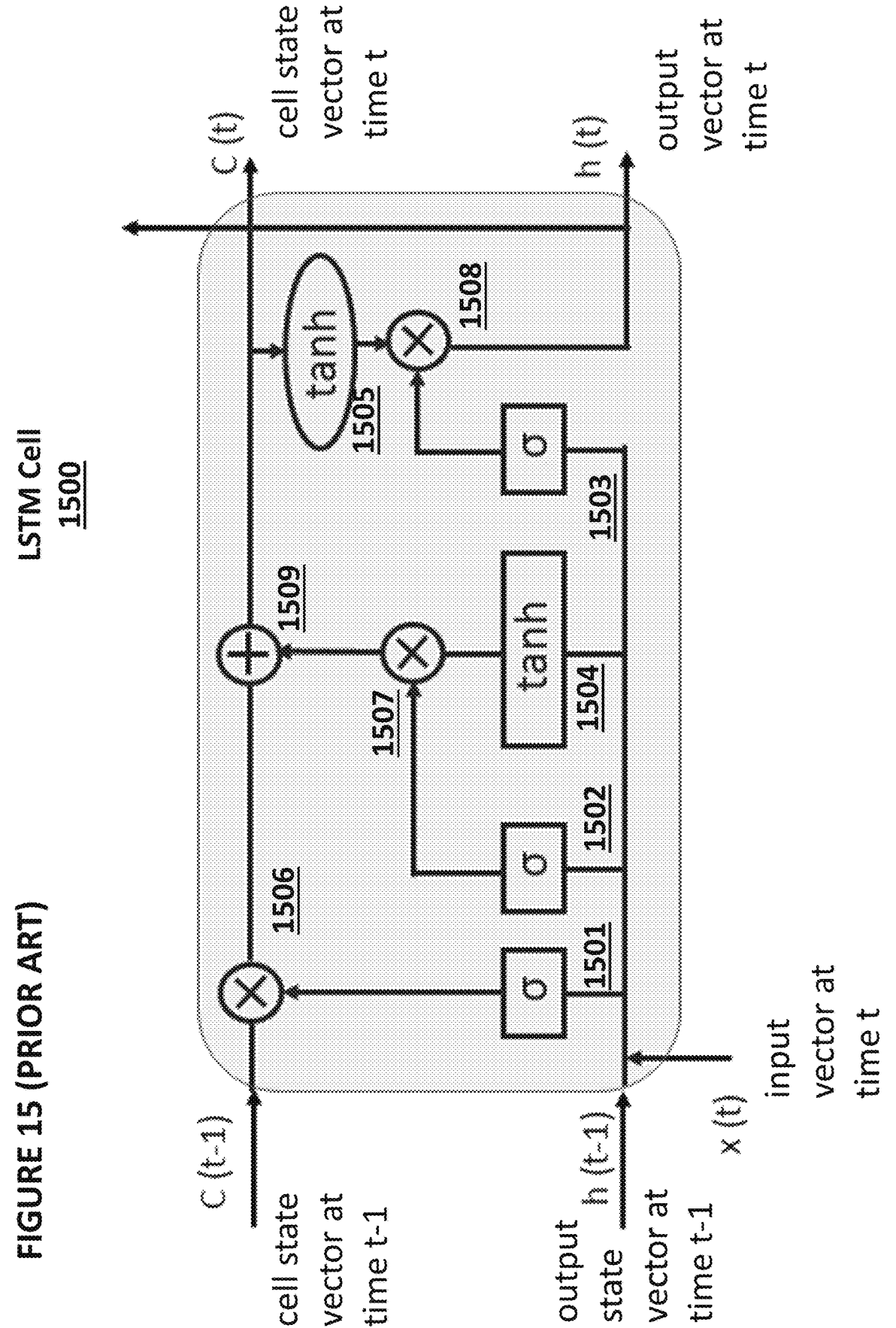
FIG. 15 depicts an example cell for use in a long short-term memory system.
Figure 18:
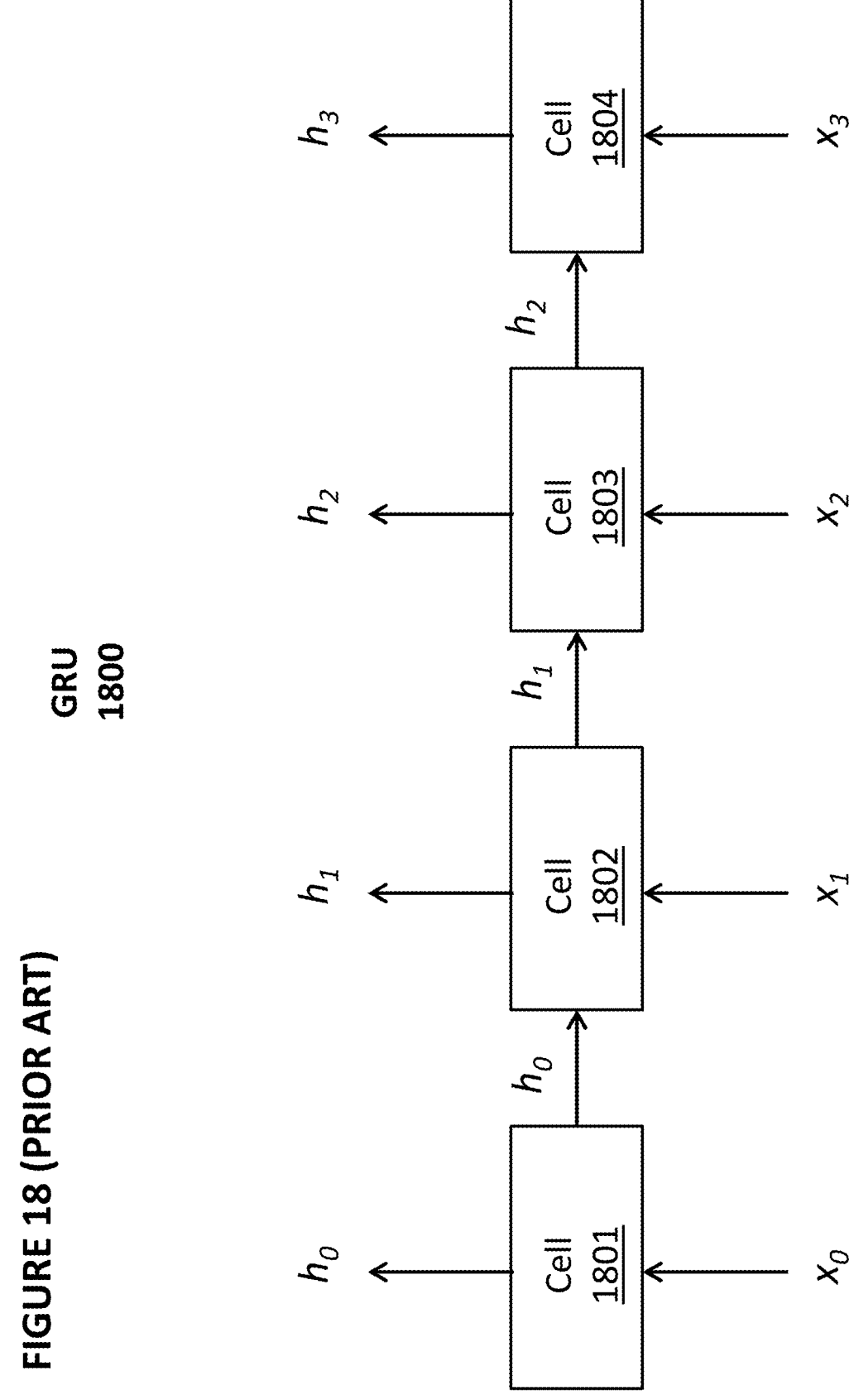
FIG. 18 depicts a prior art gated recurrent unit system.
Figure 19:
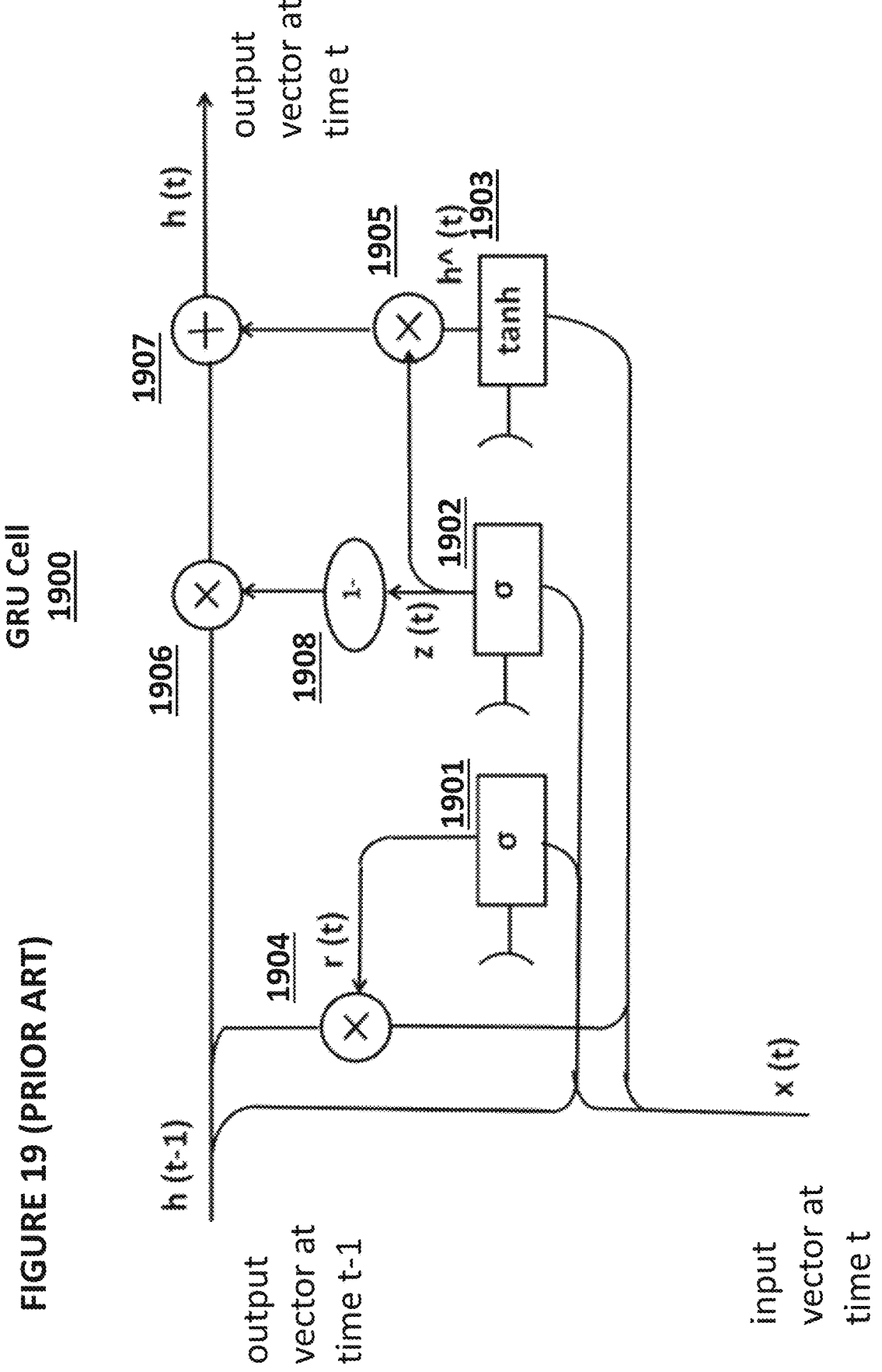
FIG. 19 depicts an example cell for use in a gated recurrent unit system.
Figure 20:
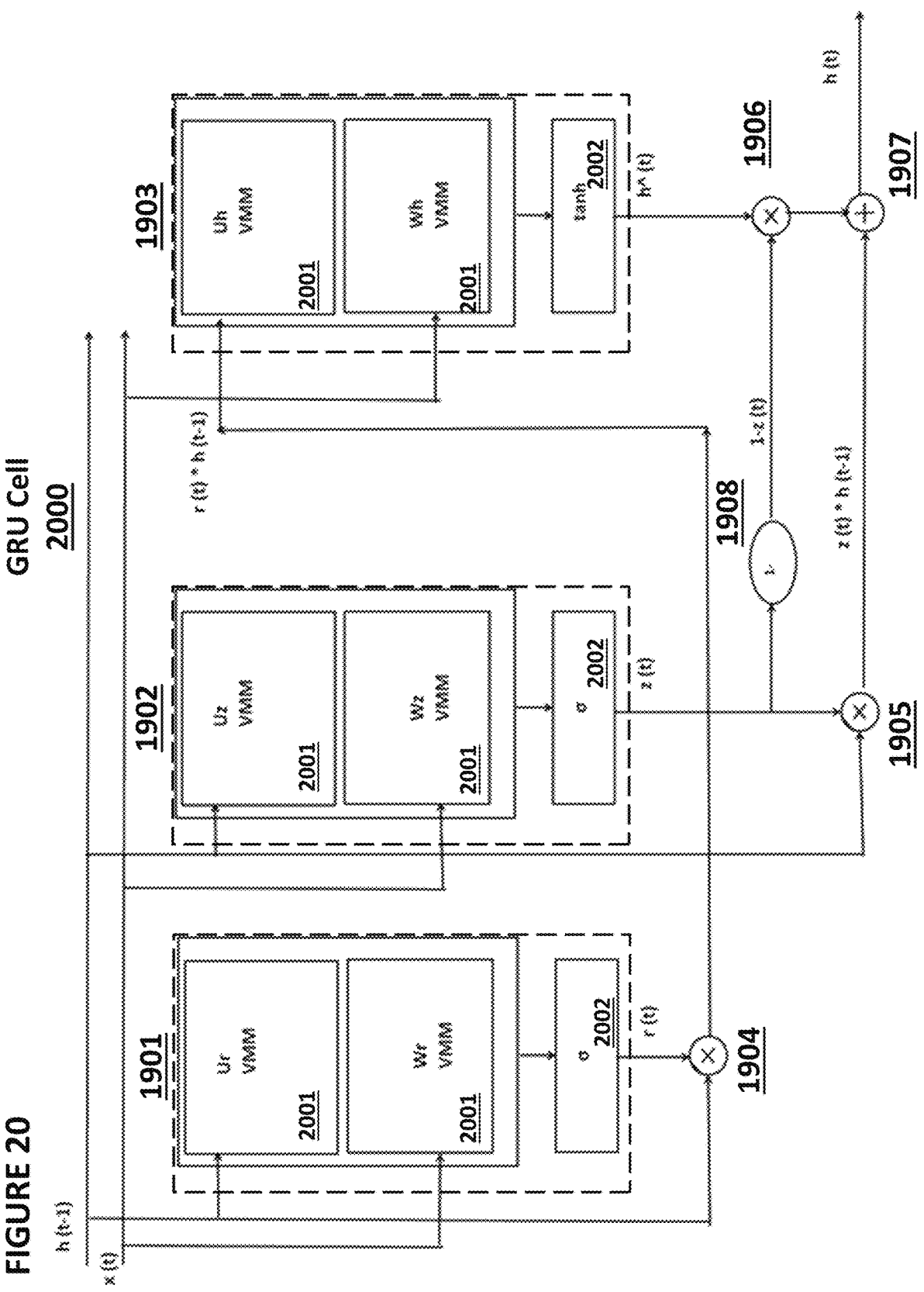
FIG. 20 depicts an example implementation t of the cell of FIG. 19.
Figure 21:
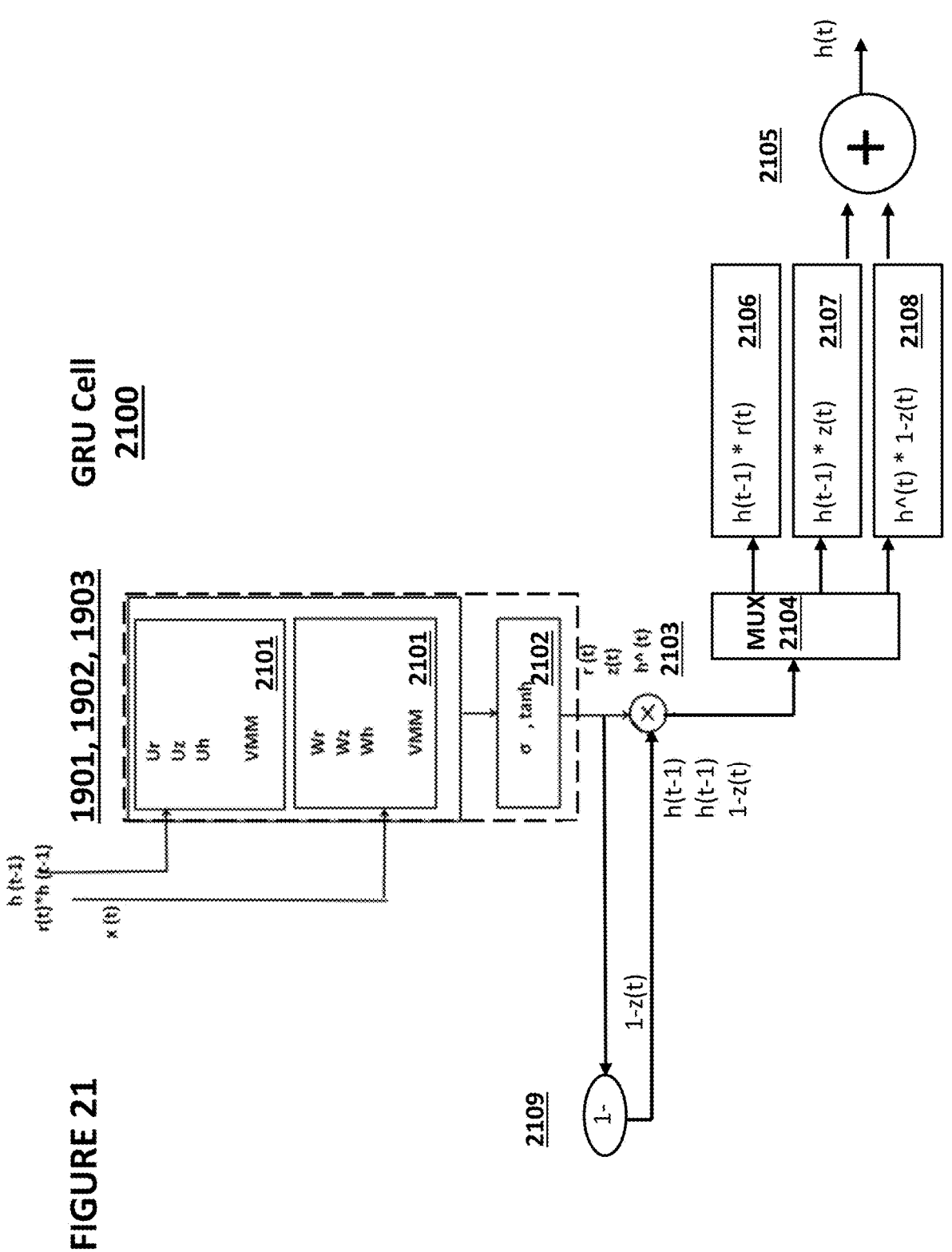
FIG. 21 depicts another example implementation of the cell of FIG. 19.
Figure 22:
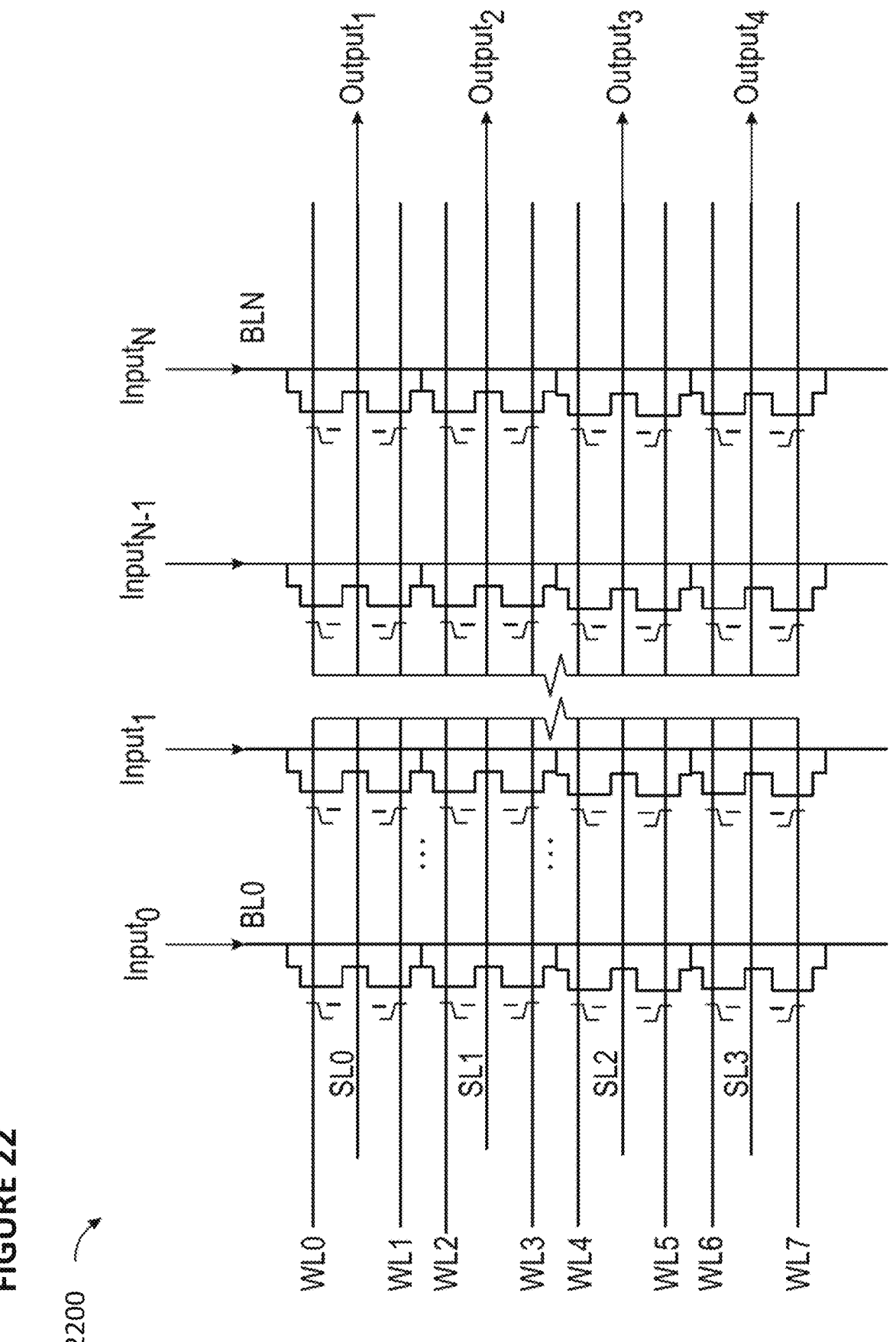
FIG. 22 depicts another example of a VMM system.
Figure 25:
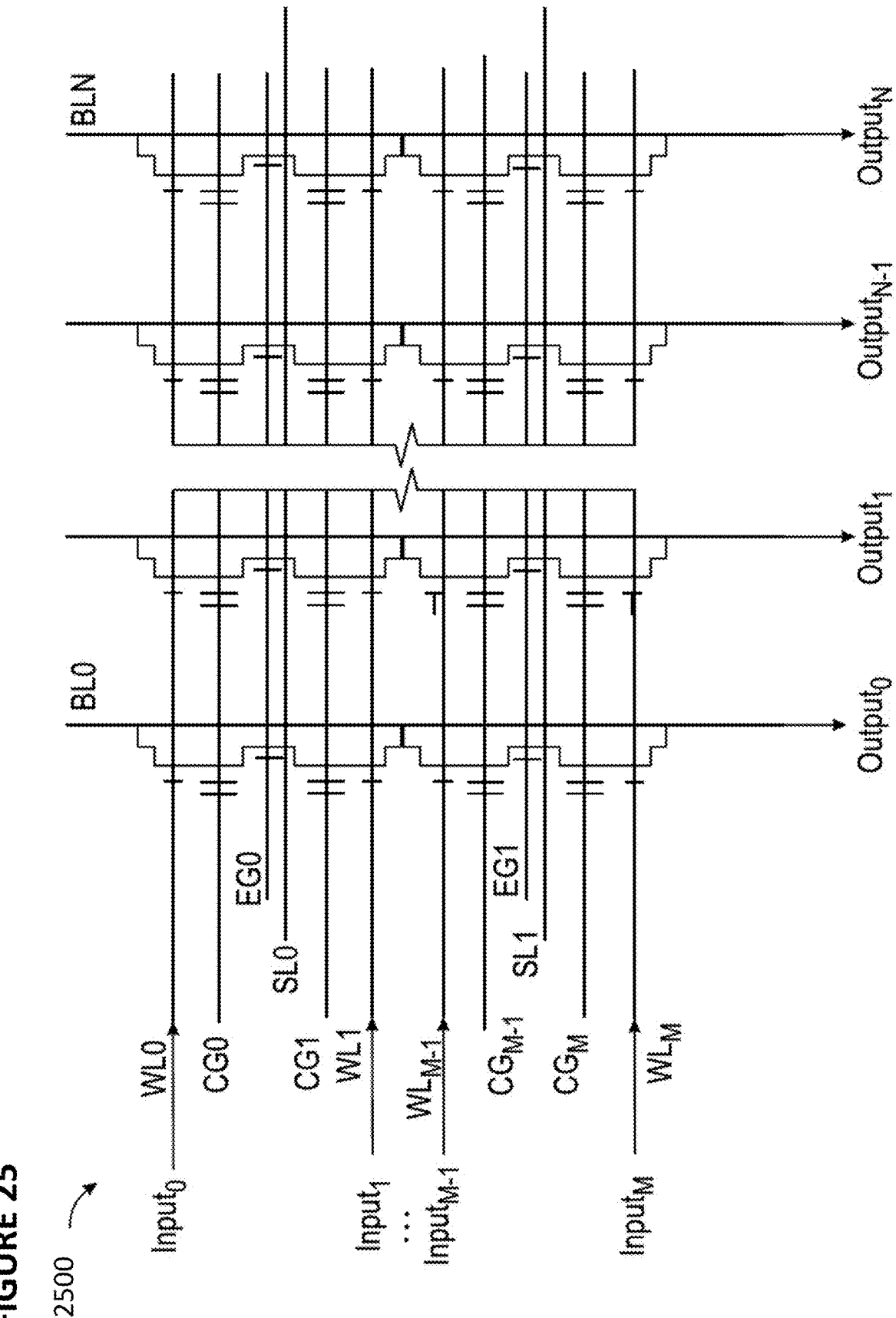
FIG. 25 depicts another example of a VMM system.
Figure 26:
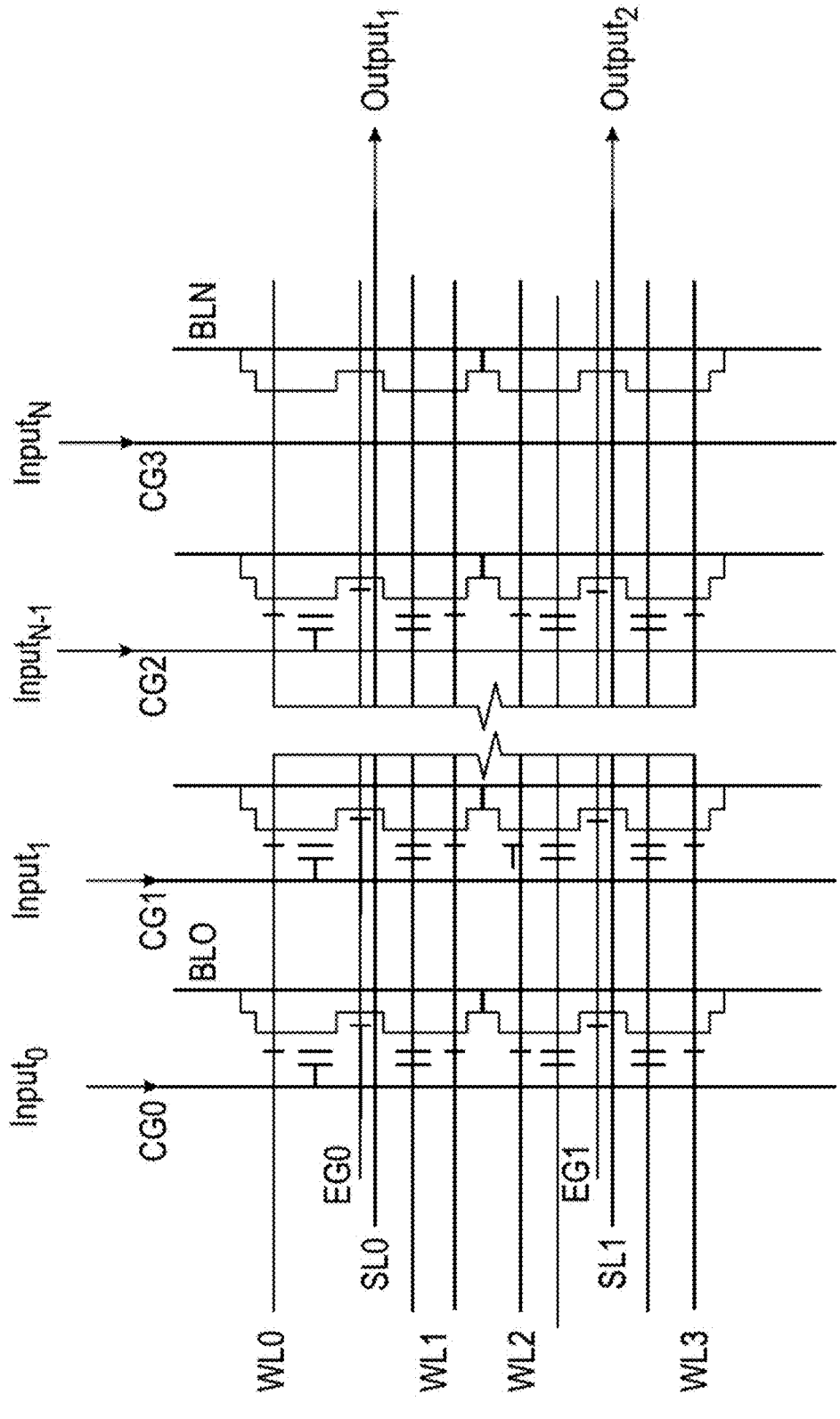
FIG. 26 depicts another example of a VMM system.
Figure 27:
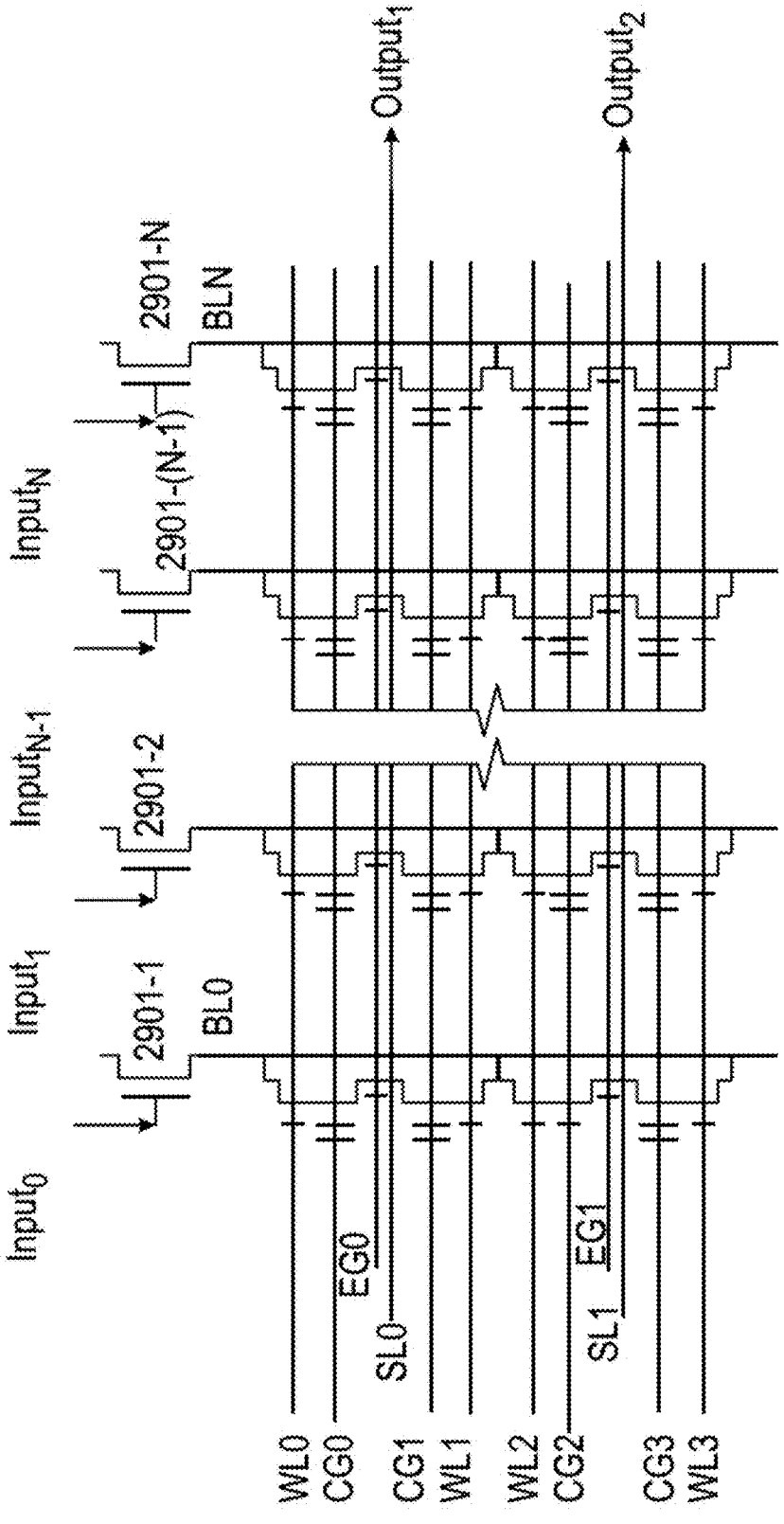
FIG. 27 depicts another example of a VMM system.
Figure 28:
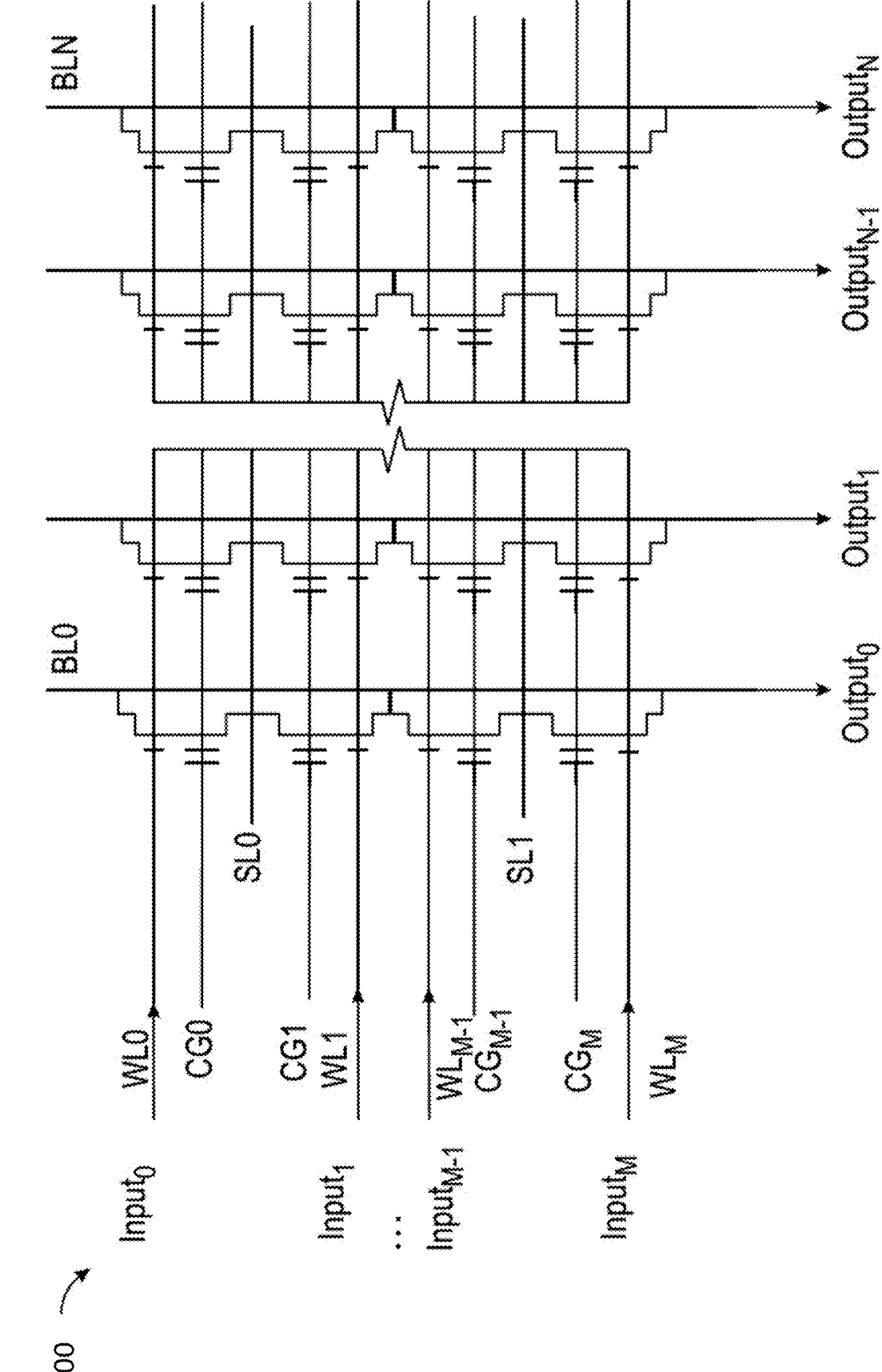
FIG. 28 depicts another example of a VMM system.
Figure 29:
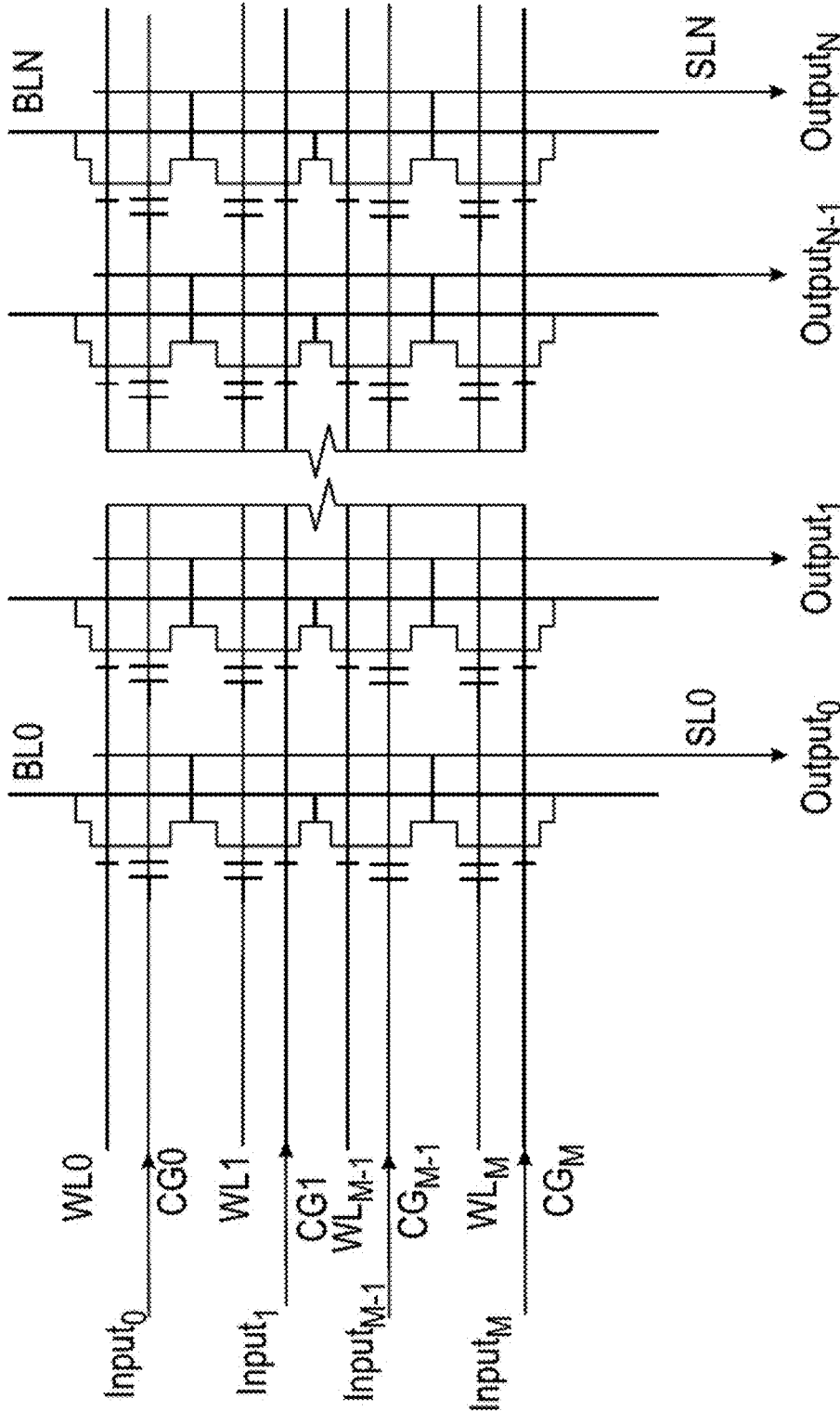
FIG. 29 depicts another example of a VMM system.
Figure 30:
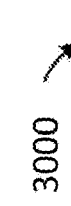
FIG. 30 depicts another example of a VMM system.
Figure 31:
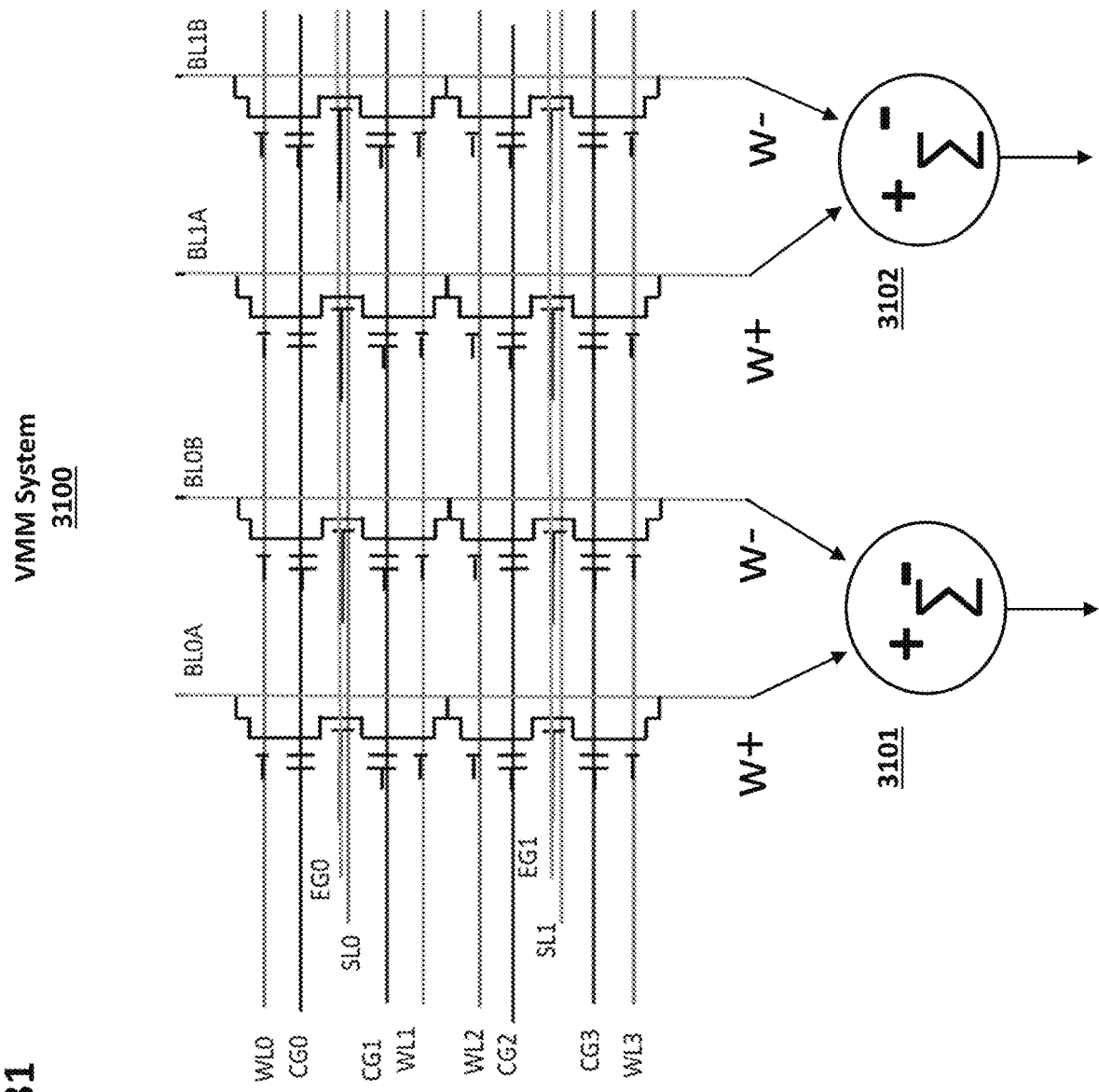
FIG. 31 depicts another example of a VMM system.
Figure 32:
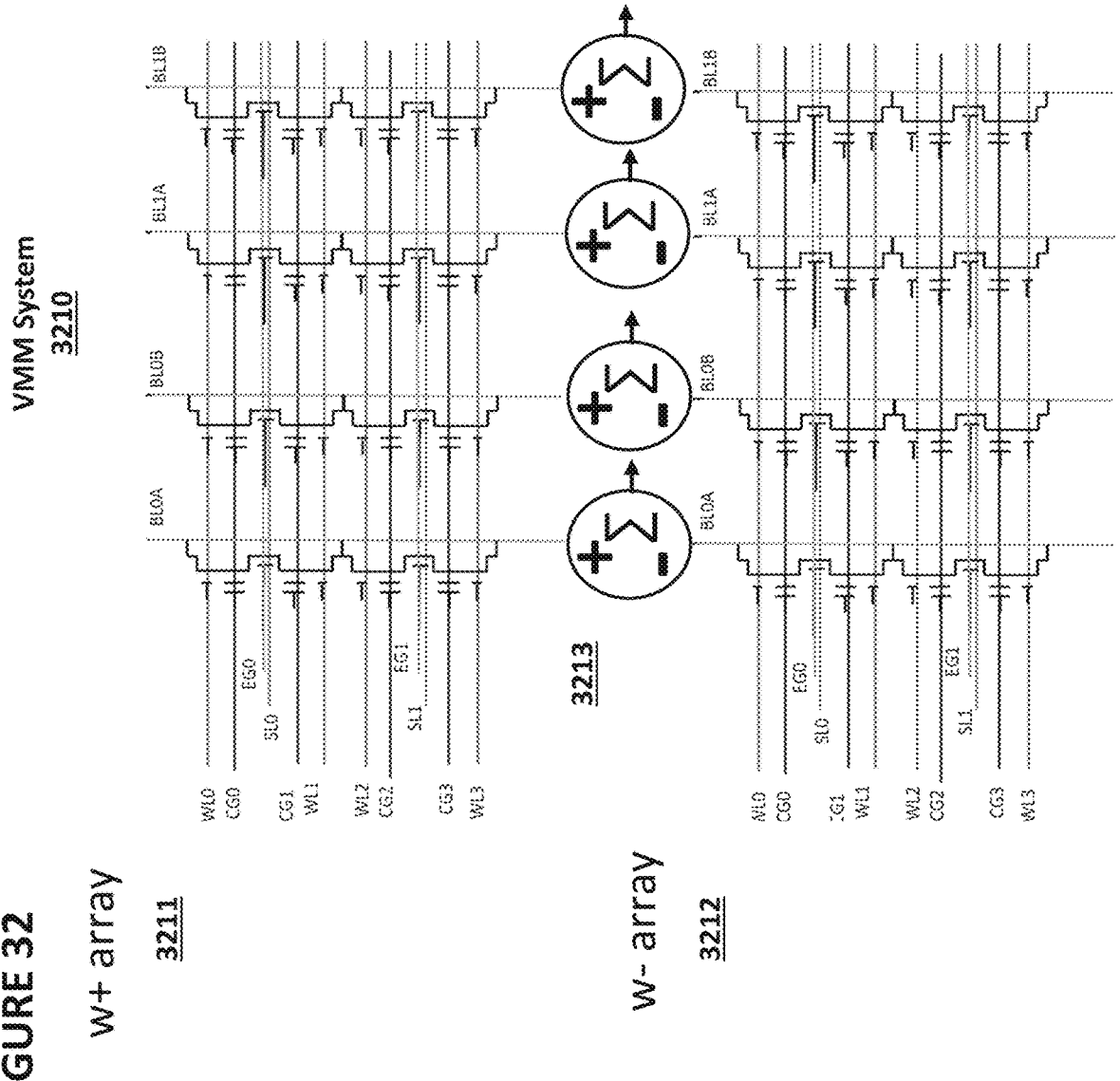
FIG. 32 depicts another example of a VMM system.
Figure 33:
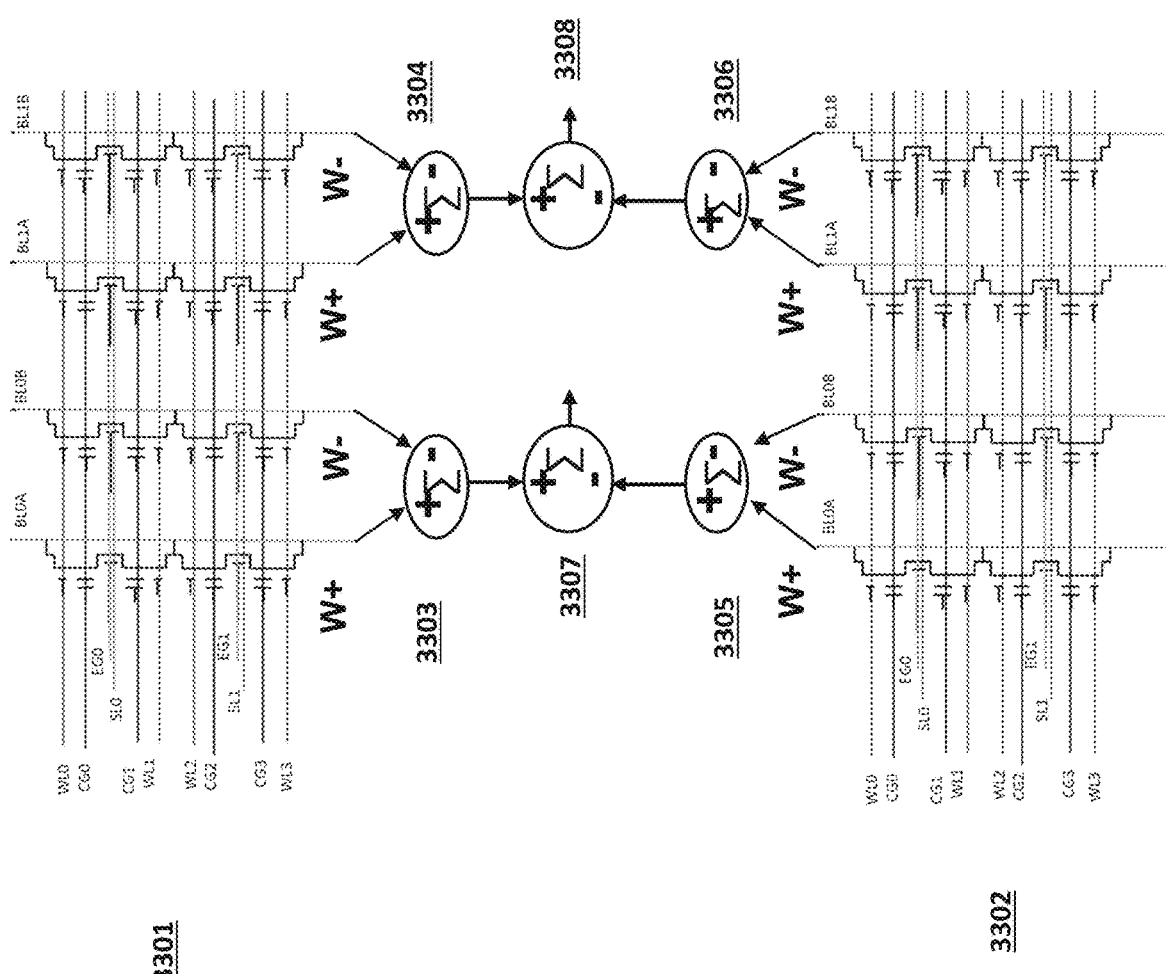
FIG. 33 depicts another example of a VMM system.
Figure 34:
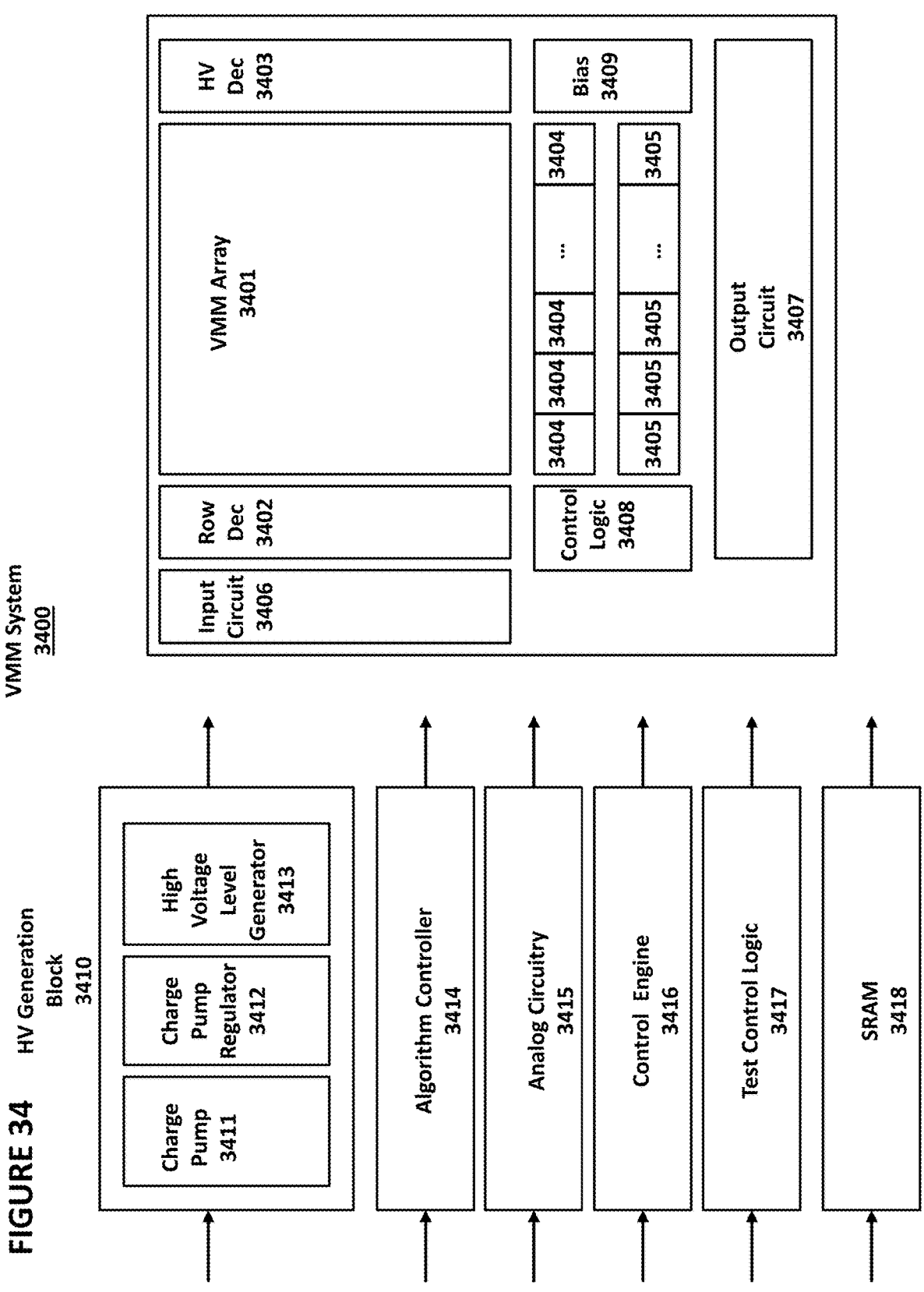
FIG. 34 depicts another example of a VMM system.

FIG. 34 depicts a block diagram of VMM system 3400. VMM system 3400 comprises VMM array 3401, row decoder 3402, high voltage decoder 3403, column decoders 3404, bit line drivers 3405 (such as bit line control circuitry for programming), input circuit 3406, output circuit 3407, control logic 3408, and bias generator 3409. VMM system 3400 further comprises high voltage generation block 3410, which comprises charge pump 3411, charge pump regulator 3412, and high voltage level generator 3413. VMM system 3400 further comprises (program/erase, or weight tuning) algorithm controller 3414, analog circuitry 3415, control engine 3416 (that may include functions such as arithmetic functions, activation functions, embedded microcontroller logic, without limitation), test control logic 3417, and static random access memory (SRAM) block 3418 to store intermediate data such as for input circuits (e.g., activation data) or output circuits (neuron output data, partial sum output neuron data) or data in for programming (such as data in for a whole row or for multiple rows).

The input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement one or more of normalization, linear or non-linear up/down scaling functions, or arithmetic functions. The input circuit 3406 may implement a temperature compensation function for input levels. The input circuit 3406 may implement an activation function such as ReLU or sigmoid. Input circuit 3406 may store digital activation data to be applied as, or combined with, an input signal during a program or read operation. The digital activation data can be stored in registers. Input circuit 3406 may comprise circuits to drive the array terminals, such as CG, WL, EG, and SL lines, which may include sample-and-hold circuits and buffers. A DAC can be used to convert digital activation data into an analog input voltage to be applied to the array.

The output circuit 3407 may include circuits such as an ITV (current-to-voltage circuit), ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. The output circuit 3407 may convert array outputs into activation data. The output circuit 3407 may implement an activation function such as rectified linear activation function (ReLU) or sigmoid. The output circuit 3407 may implement one or more of statistic normalization, regularization, up/down scaling/gain functions, statistical rounding, or arithmetic functions (e.g., add, subtract, divide, multiply, shift, log) for neuron outputs. The output circuit 3407 may implement a temperature compensation function for neuron outputs or array outputs (such as bitline output) so as to keep power consumption of the array approximately constant or to improve precision of the array (neuron) outputs such as by keeping the IV slope approximately the same over temperature. The output circuit 3407 may comprise registers for storing output data.

Figure 35:
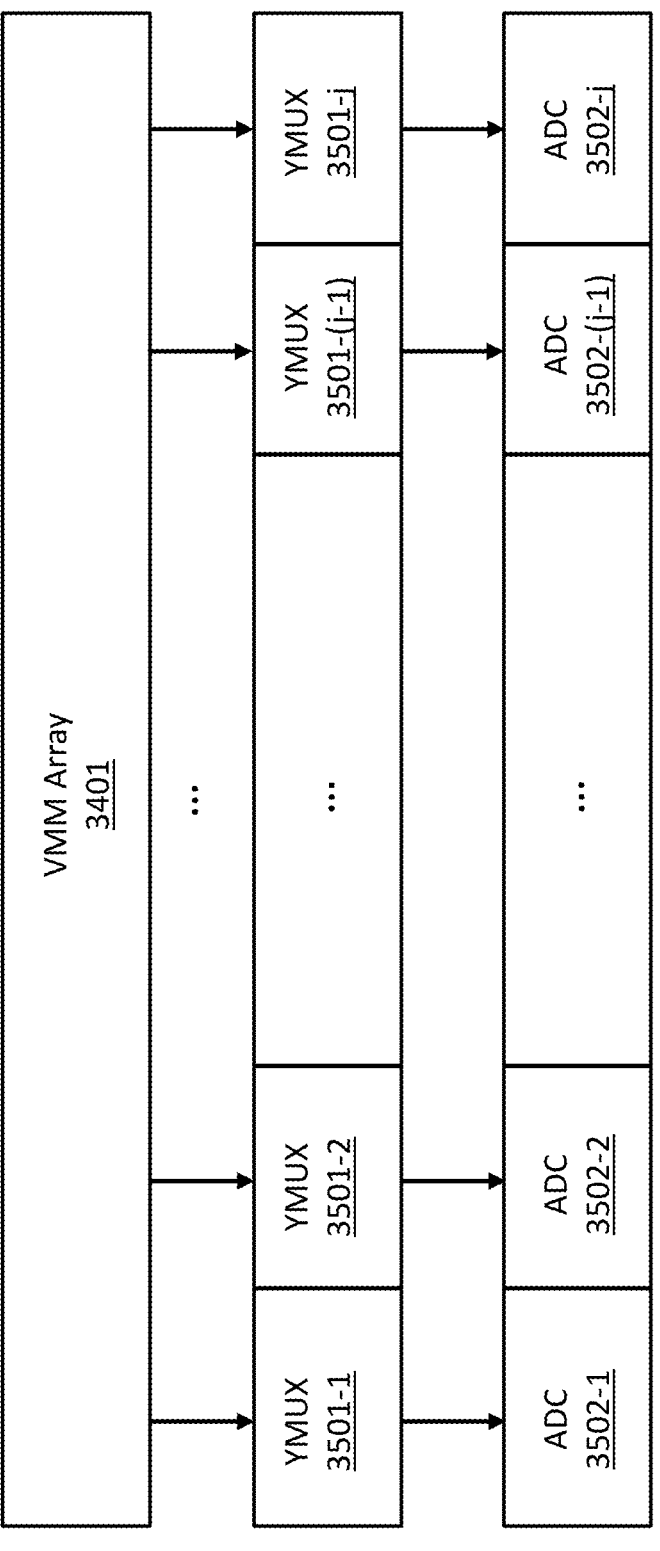
FIG. 35 depicts an output circuit.

FIG. 35 depicts output circuit 3500. Output circuit 3500 is an example implementation of output circuit 3407 in FIG. 34. Output circuit 3500 comprises column multiplexors 3501-1, 3501-2, . . . , 3501-($j$–1), 3501-$j$ and analog-to-digital converters (ADC) 3502-1, 3502-2, . . . , 3502-($j$–1), 3502-$j$. Each column multiplexor 3501 receives current, such as a bitline current, from one or more columns in VMM array 3401. If more than one column is connected to a respective column multiplexor 3501, then column multiplexor 3501 selects a column and provides the current from that column to the respective ADC 3502, which converts the received current into a digital output DOUTx [n:1], where x is the column number and DOUT comprises n bits. If j equals the number of columns in VMM array 3401, meaning that each column has its own ADC 3502, then column multiplexors 3501 are optional and each column in VMM array 3401 can connect directly to its associated ADC 3502.

Figure 36:
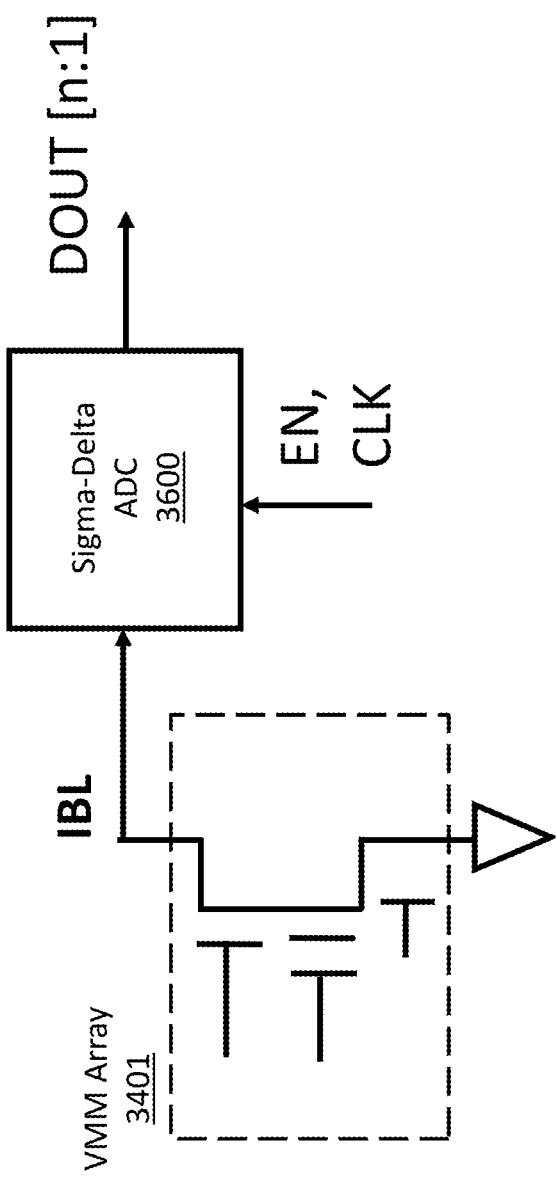
FIG. 36 depicts a sigma-delta analog-to-digital converter.

FIG. 36 depicts sigma-delta ADC 3600, which can be used for ADC 3502 in output circuit 3500 of FIG. 35. Sigma-delta ADC 3600 receives a current IBL from a column of VMM array 3401, illustrated for simplicity as a single memory cell, an enable signal, EN, and a clock signal, CLK. CLK typically will have a frequency that is higher than the frequency of clocks used for other circuitry in a VMM system as sigma-delta ADC 3600 uses CLK in performing sampling of the current received from VMM array 3401. Sigma-delta ADC 3600 outputs a digital output DOUT[n:1] comprising n bits. The sigma-delta ADC 3600 directly converts the array current IBL into digital output bits without using a current to voltage converter (ITV).

Figure 37:
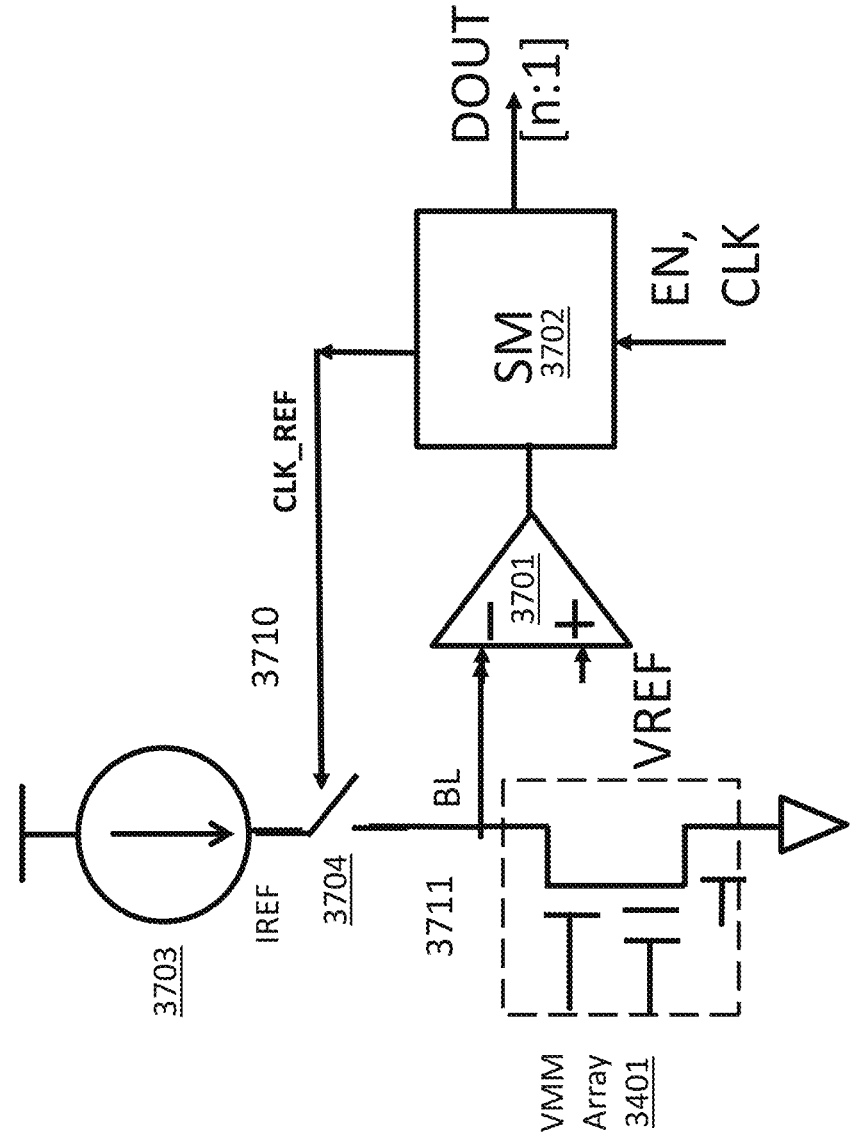
FIG. 37 depicts another sigma-delta analog-to-digital converter.

FIG. 37 depicts sigma-delta ADC 3700, which is an example of sigma-delta ADC 3600 in FIG. 36. Sigma-delta ADC 3700 comprises comparator 3701, state machine (SM) 3702, current source 3703, and switch 3704. Sigma-delta ADC 3700 is coupled to a column in VMM array 3401, illustrated for simplicity as a single memory cell 3711, which draws current from sigma-delta ADC 3700. SM 3702 can be implemented using discrete logic, a programmable device, a processor, a controller, or other mechanisms. Sigma-delta ADC 3700 is coupled to a column in VMM array 3401, illustrated for simplicity as a single memory cell, which draws current from sigma-delta ADC 3700. Sigma-delta ADC 3700 also receives an enable signal, EN; a clock signal, CLK; and a reference voltage, VREF. Current source 3703 provides a reference current IREF and is an example of an injection circuit. Switch 3704 is controlled by SM 3702. Comparator 3701 comprises a first terminal (here, the inverting terminal) coupled to the column (illustrated as memory cell 3711) and to current source 3703 through switch 3704 and a second terminal (here, the non-inverting terminal) coupled to a reference voltage, VREF. SM 3702 receives the output of comparator 3701. When the voltage on bitline (BL) node of memory cell 3711 is <VREF, then the clock signal CLK is passed by SM 3702, or converted by SM 3702 to a converted clock signal, as the signal CLK_REF 3710, which signal CLK_REF 3710 has therefore a clock pulse with the same or inverted polarity as clock signal CLK. In the event that the clock signal CLK has been converted by SM 3702, then the clock pulse of signal CLK_REF 3710 may have a different duty cycle, or polarity, than the clock pulse of clock signal CLK, which signal CLK_REF 3710 controls the switch 3704. When signal CLK_REF is asserted during each clock cycle, switch 3704 is closed and Iref from current source 3703 is enabled to flow into BL node of memory cell 3711, which raises the voltage on BL node or memory cell 3711. Signal CLK_REF continues to clock, responsive to clock signal CLK, and at each assertion of signal CLK_REF, injects current IREF into the BL node of memory cell 3711, i.e. injects a charge Qref proportional to IREF*T into the BL node or memory cell 3711, where T is the assertion time of signal CLK_REF, until the voltage on BL node of memory cell 3711>VREF, at which point SM 3702 will hold signal CLK_REF de-asserted, meaning the CLK pulse is not passed to, or converted by SM 3702 for transmission to signal CLK_REF. In response to the commencement of a read operation, VMM array 3401 draws current to reduce the on BL node of memory cell 3711 low. In the absence of additional charge, since signal CLK_REF is de-asserted, VMM array 3401 draws current to reduce the on BL node of memory cell 3711 low until it is <VREF, and then the process repeats. SM 3702 keeps track of the clocking on the signal CLK_REF produces digital output bits DOUT[n:] in response. DOUT[n:1] from SM 3702 in this example is a digital representation of a count value of the number of times switch 3704 is closed during a certain number of cycles of the clock signal CLK, and reflects the amount of current drawn by VMM array 3401. For example, an 8-bit digital out DOUT[7:0] can be output for 512 CLK cycles. A high value will indicate that switch 3704 was opened and closed a relatively large number of times, signifying a large current being drawn by VMM array 3401, since the amount of charge provided by current source 3703 to BL node of memory cell 3711 to match the amount of current drawn by VMM array 3401 was therefore relatively large, while a low value will indicate that switch 3704 was opened and closed a relatively small number of times, signifying a small current being drawn by VMM array 3401. The digital output value reflects to the total charge (i.e., amount of Qref) that is injected into the BL to balance out the array current (to keep the BL constant), smaller current results in smaller digital output value as larger current results in larger digital output values. DOUT [n:1] indicates a value of the current drawn by the column (illustrated as memory cell 3711).

Figure 38:
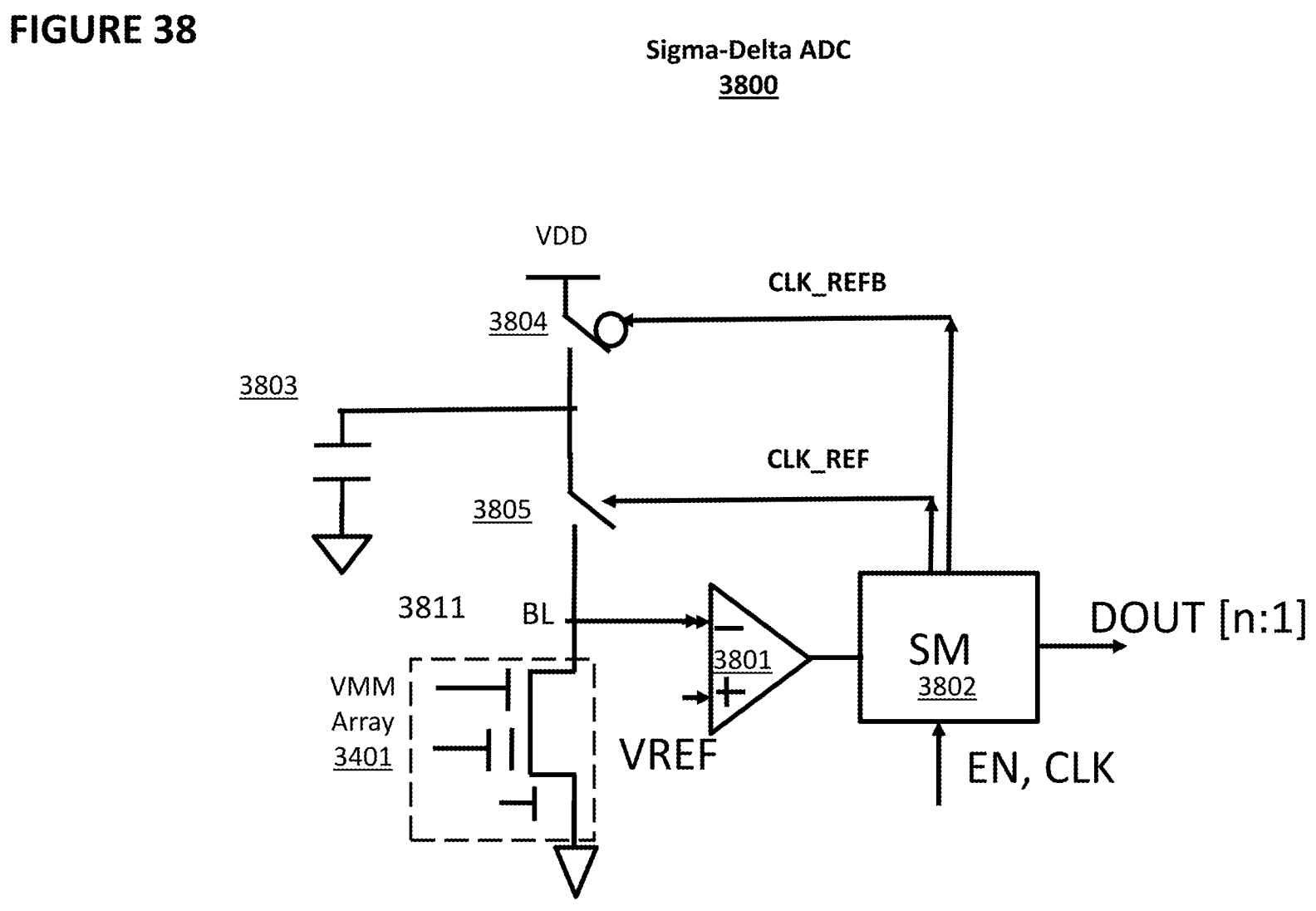

FIG. 38 depicts sigma-delta ADC 3800, which is an example of sigma-delta ADC 3600 in FIG. 36. Sigma-delta ADC 3800 comprises comparator 3801, SM 3802, capacitor CREF 3803, switch 3804, and switch 3805. Sigma-delta ADC 3800 is coupled to a column in VMM array 3401, illustrated for simplicity as a single memory cell 3811, which draws current from sigma-delta ADC 3700. SM 3802 provides control signals CLK_REFB and CLK_REF to switches 3804 and 3805, respectively. CLK_REFB is logically opposite to that of CLK_REF. Switch 3804 is used to charge capacitor 3803 to a certain voltage (VDD in this case) when it is closed (when CLK_REFB is asserted), and the switch 3805, when closed (when CLK_REF is asserted) causes the charge from capacitor 3803 to discharge into the bitline (BL) node of single memory cell 3811, where the reference charge Qref on capacitor 3803 will decrease in proportion to (VDD-voltage of BL node of cell 3811)*the capacitance of capacitor 3803. That is, for each clock pulse in the signal CLK_REF and CLK_REFB, a reference charge Qref is injected into the BL node of cell 3811 where it flows as current through memory cell 3811 to ground. Capacitor 3803 is an example of an injection circuit. Sigma-delta ADC 3800 is coupled to a column in VMM array 3401, which draws current from sigma-delta ADC 3800. Comparator 3801 comprises a first terminal (here, the inverting terminal) coupled to the column (illustrated as memory cell 3811) and to capacitor 3803 through switch 3805 and a second terminal (here, the non-inverting terminal) coupled to a reference voltage, VREF. SM 3802 receives the output of comparator 3801. Sigma-delta ADC 3800 also receives an enable signal, EN; a clock signal, CLK; and a reference voltage, VREF. The capacitor 3803 will behave equivalently to current source 3703 in FIG. 37 by injecting a reference charge instead of a reference current into the BL node or memory cell 3811. Sigma-delta ADC 3800 otherwise operates in a similar manner to sigma-delta ADC 3700 in FIG. 37 with the main difference being that it uses a reference charge instead of a reference current. Output bits, DOUT[n:1], from SM 3802 is a digital count value of the number of times switch 3805 is closed during a certain number of cycles within the clock signal CLK. A higher value will indicate that switch 3805 was opened and closed a relatively large number of times, signifying a large current being drawn by VMM array 3401, while a lower value will indicate that switch 3805 was opened and closed a relatively small number of times, signifying a small current being drawn by VMM array 3401.

Figure 39:
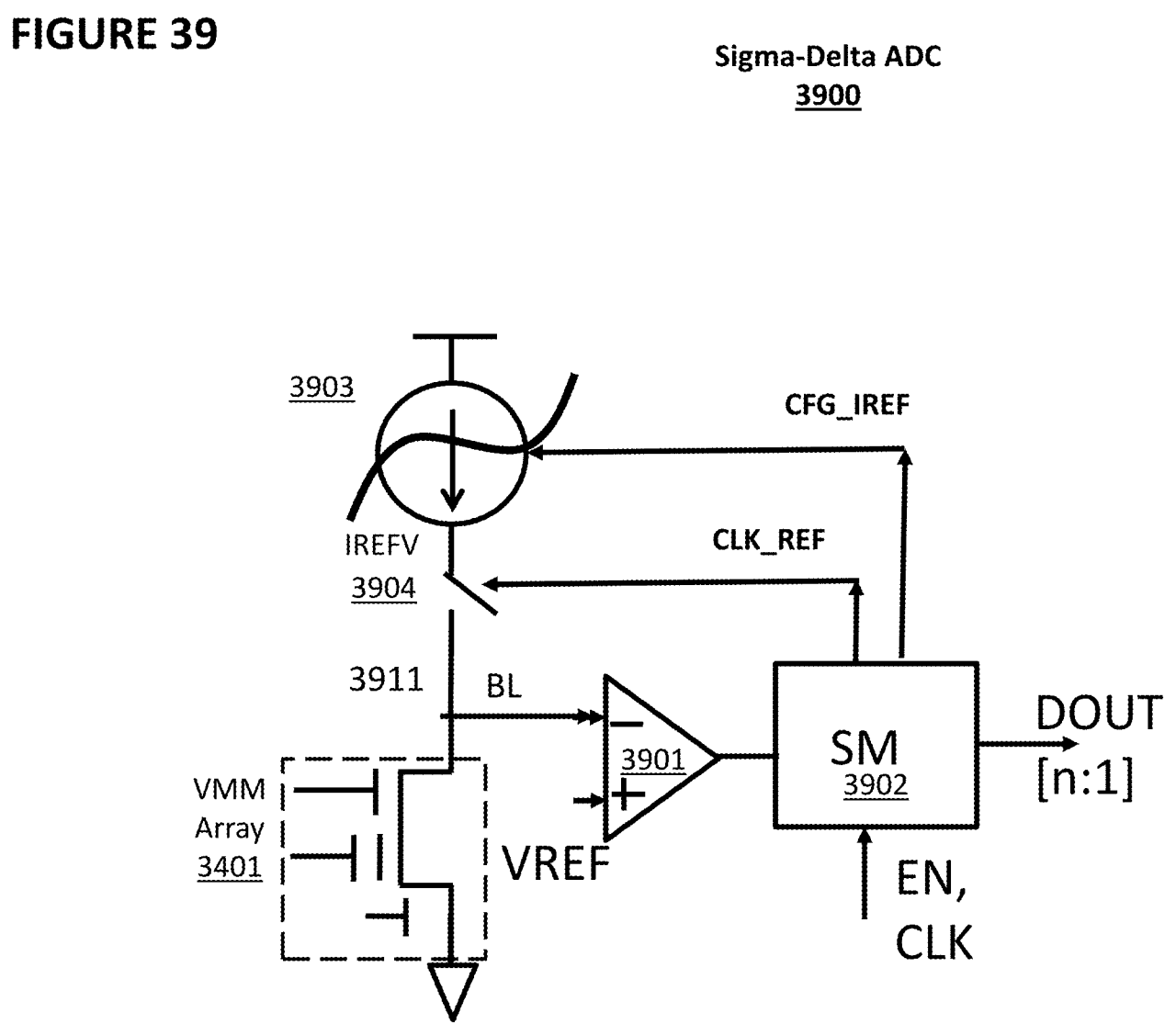

FIG. 39 depicts sigma-delta ADC 3900, which is an example of sigma-delta ADC 3600 in FIG. 36. Sigma-delta ADC 3900 is similar to sigma-delta ADC 3700 in FIG. 37 except that it uses adjustable current source 3903 (which is an example of an injection circuit) that generates variable reference current IREFV instead of a fixed reference current. Furthermore, variable reference current source 3903 is controlled by SM 3902 or by a global control signal (not shown). Variable reference current source 3903 can be adjusted to provide different amounts of reference current so as to compensate for different array current ranges, different bitline capacitance, or any variation over PVT (process temperature and voltage). Comparator 3901 comprises a first terminal (here, the inverting terminal) coupled to the column (illustrated as memory cell 3911) and to adjustable current source 3903 through switch 3904 and a second terminal (here, the non-inverting terminal) coupled to a reference voltage, VREF. SM 3902 receives the output of comparator 3901.

Figure 40:
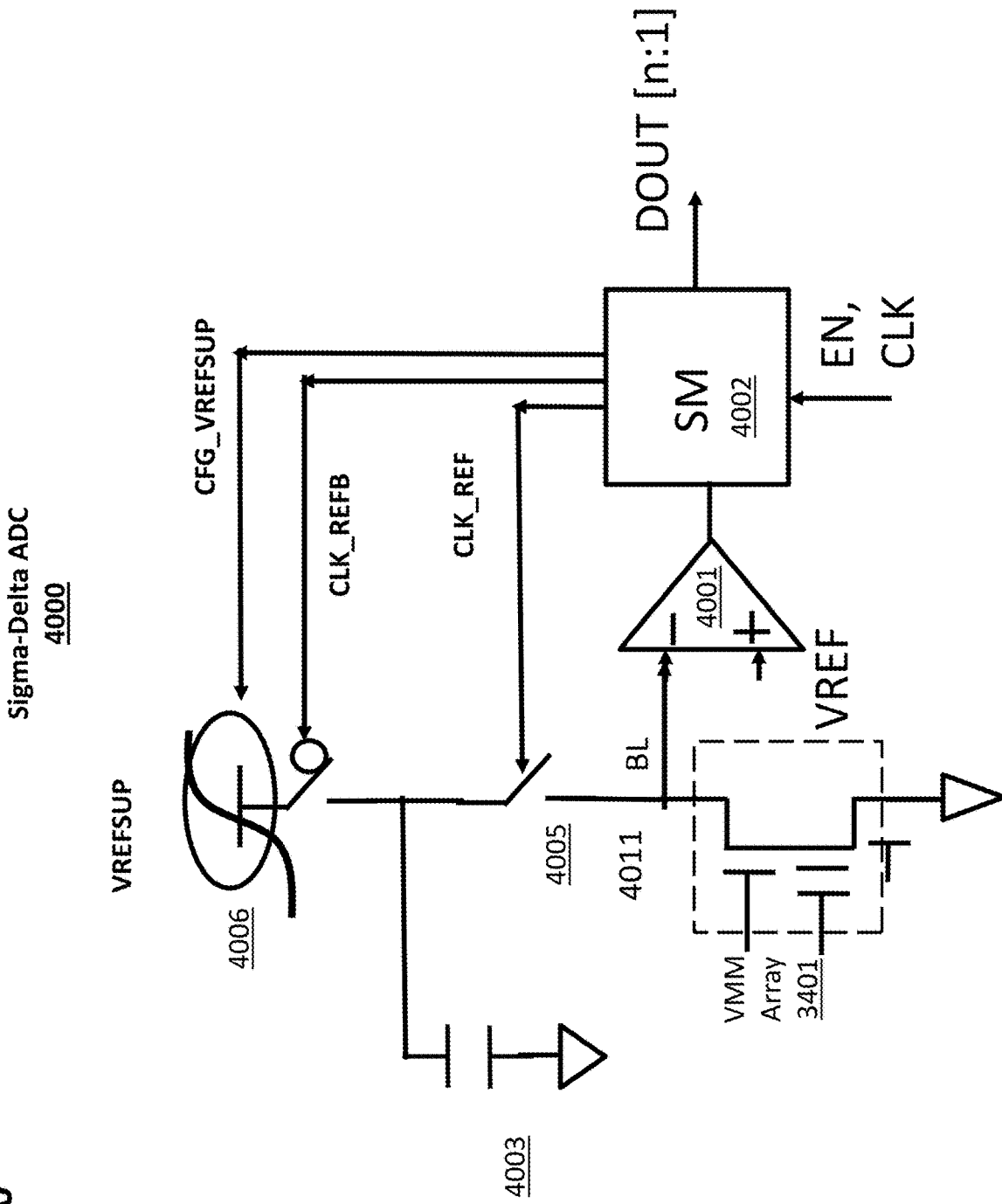
FIG. 40 depicts another sigma-delta analog-to-digital converter.

FIG. 40 depicts sigma-delta ADC 4000, which is an example of sigma-delta ADC 3600 in FIG. 36. Sigma-delta ADC 4000 is similar to sigma-delta ADC 3800 in FIG. 38 except that the voltage, VREFSUP, to reference capacitor 4003 is supplied by variable reference supply 4006. Capacitor 4003 is an example of an injection circuit. Furthermore, variable reference supply 4006 generates a variable voltage in response to SM 4002 or by a global control signal (not shown), i.e. the amount of voltage provided by variable reference supply 4006 may be adjusted in response to a signal CFG_VREFSUP, which signal CFG_VREFSUP may be provided by SM 4002. The voltage provided by variable reference supply 4006 can be adjusted to compensate for different array current ranges, different bitline capacitance, or any variation over PVT (process temperature and voltage). Comparator 4001 comprises a first terminal (here, the inverting terminal) coupled to the column (illustrated as memory cell 4011) and to capacitor 4003 through switch 4005 and a second terminal (here, the non-inverting terminal) coupled to a reference voltage, VREF. SM 4002 receives the output of comparator 4001.

Figure 41:
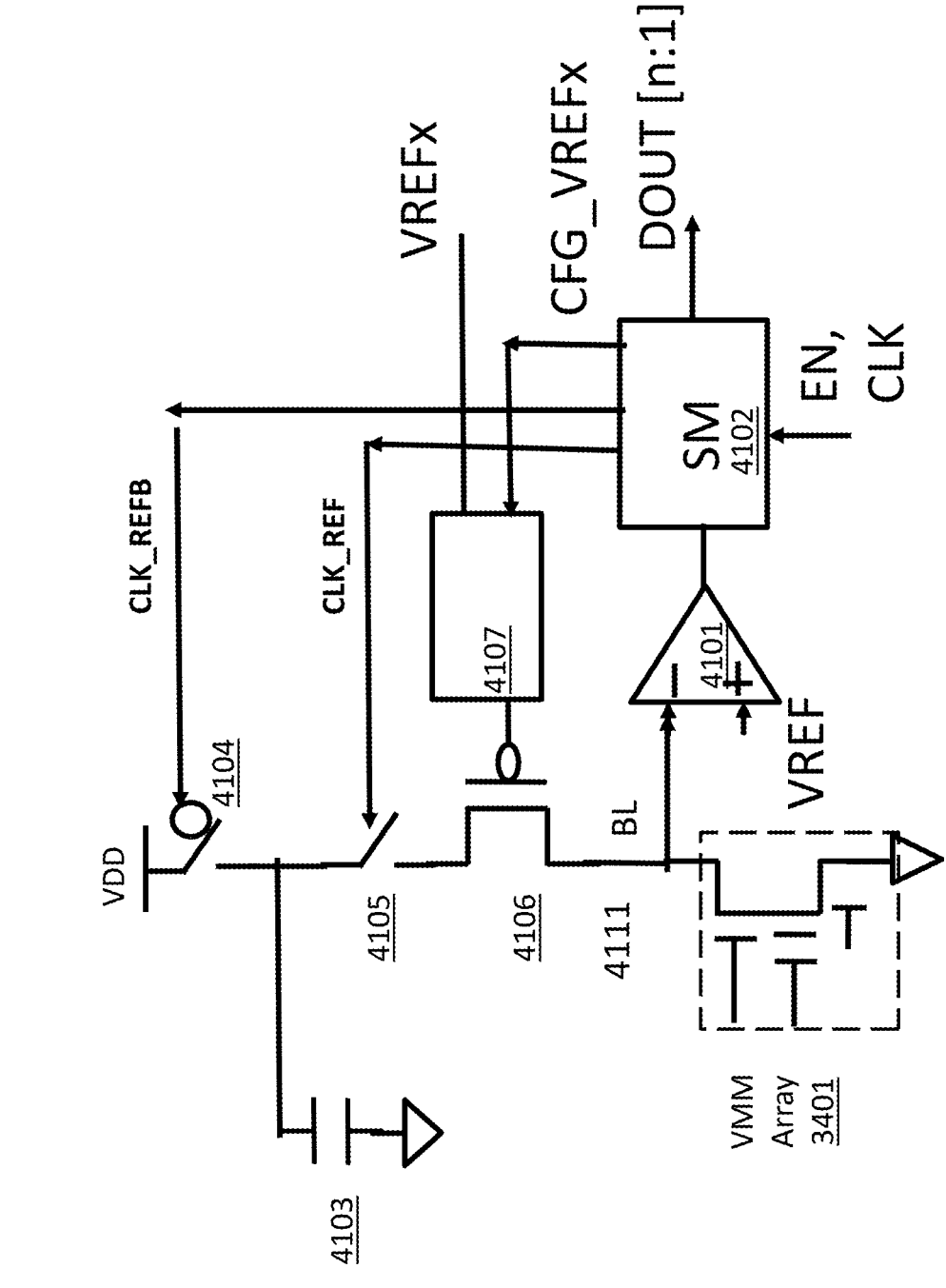
FIG. 41 depicts another sigma-delta analog-to-digital converter.

FIG. 41 depicts sigma-delta ADC 4100, which is an example of sigma-delta ADC 3600 in FIG. 36. Sigma-delta ADC 4100 comprises comparator 4101, SM 4102, capacitor CREF 4103, switch 4104, switch 4105, transistor 4106, and gate driver 4107, which gate driver 4107 drives the gate of transistor 4106. Sigma-delta ADC 4100 is similar to sigma-delta ADC 3800 in FIG. 38 except for the use of transistor 4106 with its gate controlled by a reference voltage provided by gate driver 4107. Comparator 4101 comprises a first terminal (here, the inverting terminal) coupled to the column (illustrated as memory cell 4111) and to capacitor 4103 (which is an example of an injection circuit) through switch 4105 and a second terminal (here, the non-inverting terminal) coupled to a reference voltage, VREF. SM 4102 receives the output of comparator 4101. The transistor 4106 is used to control how much charge is transferred (injected) into BL node of memory cell 4111. The injected charge is proportional to (Vdd−(VREFX+Vt_4106))*capacitance of capacitor 4103, where Vt_4106 is the threshold voltage of the transistor 4106. VREFx can be controlled by SM 4102 or by a global control signal (not shown). It can be used to compensate for different array current range, different bitline capacitance, or any variation over PVT (process temperature and voltage).

Figure 42:
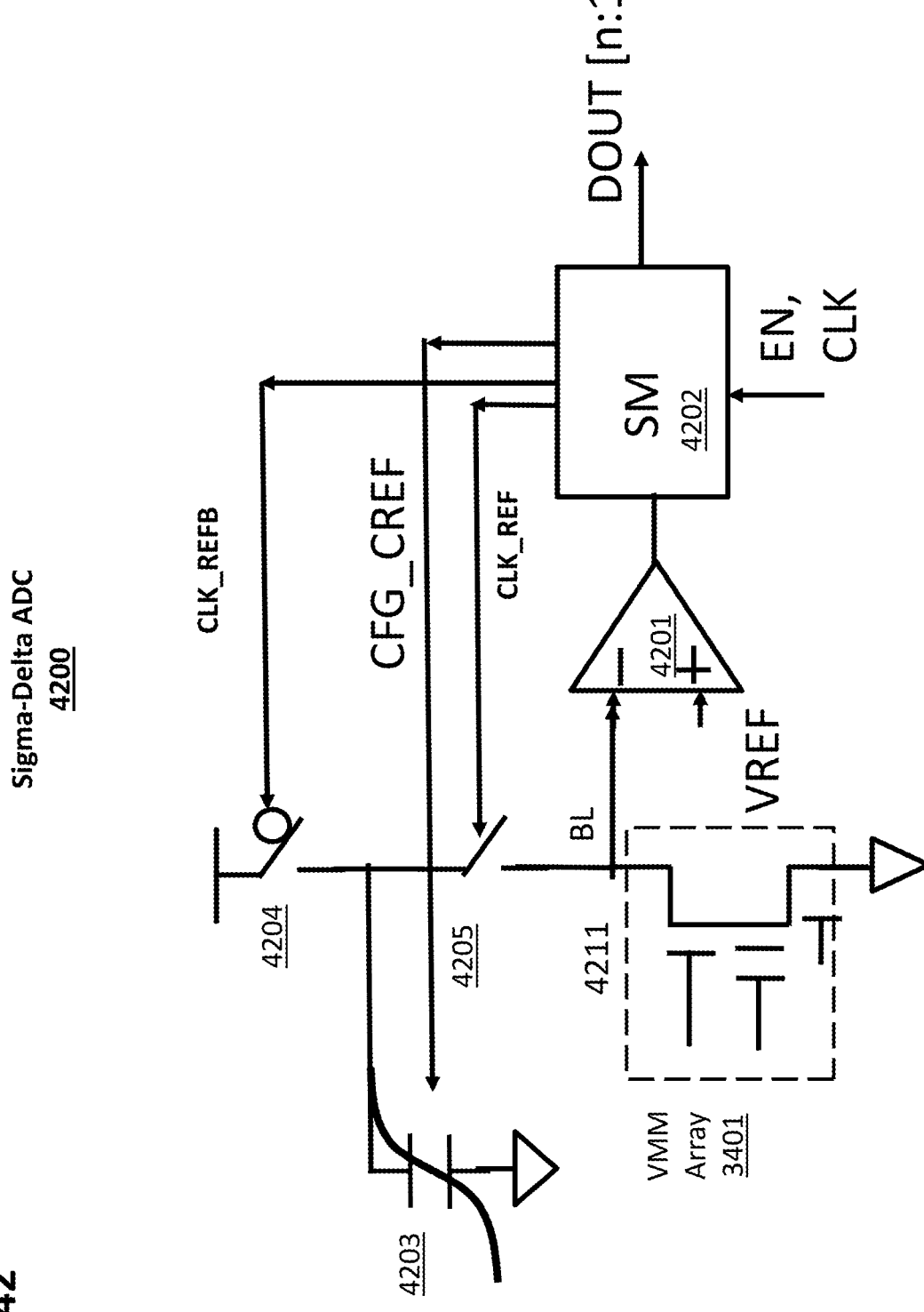
FIG. 42 depicts another sigma-delta analog-to-digital converter.

FIG. 42 depicts sigma-delta ADC 4200, which is an example of sigma-delta ADC 3600 in FIG. 36. Sigma-delta ADC 4200 comprises comparator 4201, SM 4202, adjustable capacitor 4203, switch 4204, and switch 4205. Sigma-delta ADC 4200 is similar to sigma-delta ADC 4000 in FIG. 40 except that adjustable capacitor 4203 is used instead of a variable reference supply. The adjustable capacitor 4203 generates a variable charge in response to SM 3902 or by a global control signal (not shown), i.e. the amount of capacitance provided by adjustable capacitor 4203 is responsive to signal CFG_CREF, which signal CFG_CREF may be provided by SM 4202. Signal CFG_CREF and adjustable capacitor 4203 can be used to compensate for different array current range, different bitline capacitance, or any variation over PVT (process temperature and voltage). Comparator 4201 comprises a first terminal (here, the inverting terminal) coupled to the column (illustrated as memory cell 4211) and to adjustable capacitor 4203 (which is an example of an injection circuit) through switch 4205 and a second terminal (here, the non-inverting terminal) coupled to a reference voltage, VREF. SM 4202 receives the output of comparator 4201.

Figure 43:
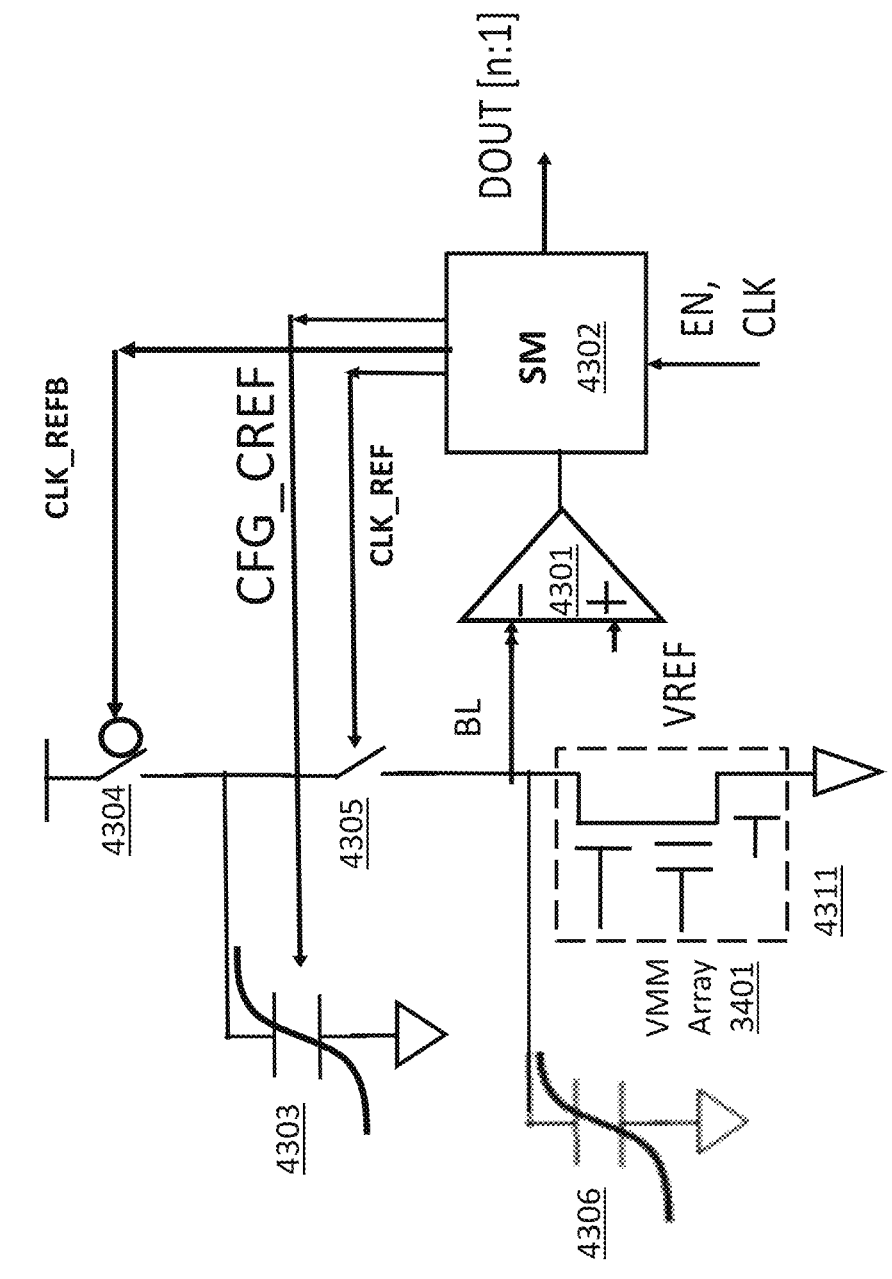
FIG. 43 depicts another sigma-delta analog-to-digital converter.

FIG. 43 depicts sigma-delta ADC 4300, which is an example of sigma-delta ADC 3600 in FIG. 36. Sigma-delta ADC 4300 comprises comparator 4301, SM 4302, variable capacitor 4303, variable dummy BL capacitor 4306, switch 4304, and switch 4305. Sigma-delta ADC 4300 is similar to sigma-delta ADC 4200 except that variable dummy BL capacitor 4306 has been added in parallel with VMM array 3401. The variable dummy BL capacitor 4306 generates a variable charge in response to SM 4302 or by a global control signal (not shown), i.e. the amount of capacitance provided by variable dummy BL capacitor 4306 may be varied in response to SM 4302 or by a global control signal (not shown), which can be used to compensate for different array current range, different bitline capacitance, or any variation over PVT (process temperature and voltage). Comparator 4301 comprises a first terminal (here, the inverting terminal) coupled to the column (illustrated as memory cell 4311) and to adjustable capacitor 4306 and adjustable capacitor 4303 (which together form an example of an injection circuit) through switch 4305 and a second terminal (here, the non-inverting terminal) coupled to a reference voltage, VREF. SM 4302 receives the output of comparator 4301.

Figures 44A, 44B:
FIGS. 44A and 44B depict waveforms for a sigma-delta analog-to-digital converter.

FIGS. 44A and 44B depict example waveforms 4400 and 4410 that illustrate the operation of sigma-delta ADCs 3600, 3700, 3800, 3900, 4000, 4100, 4200, and 4300. In waveforms 4400, VMM array 3401 draws a current I1 while in waveforms 4410, VMM array 3401 draws a current half that amount, I½. VBL is the voltage of the bit line in VMM array 3401 that is coupled to the inverting input of the respective comparator 3701, 3801, 3901, 4001, 4101, 4201, and 4301, and VREF is the voltage provided to the the non-inverting input of respective comparator 3701, 3801, 3901, 4001, 4101, 4201, and 4301. Clock signal CLK and the signal CLK_REF are shown, with the output of the respective comparator 3701, 3801, 3901, 4001, 4101, 4201, and 4301 illustrated as signal COMP_OUT. VBL rises when the respective switched 3704, 3805, 3904, 4005, 4105, 4205, and 4305 are closed and thereafter falls when those switches are opened. The number of times that respective switches 3704, 3805, 3904, 4005, 4105, 4205, and 4305 are closed (or opened) is counted, and the count value over a certain time period is output as the digital output DOUT[n:1]. In waveforms 4400, the count is 4 during the 16 periods of clock signal CLK shown. In waveforms 4410, the count is 2 during the 16 periods of clock signal CLK shown since the array current is half of that in waveforms 4400 in FIG. 44A. The relevant period in which the count is measured can be greater than, or less than, 16 periods of clock signal CLK.

Figure 45:
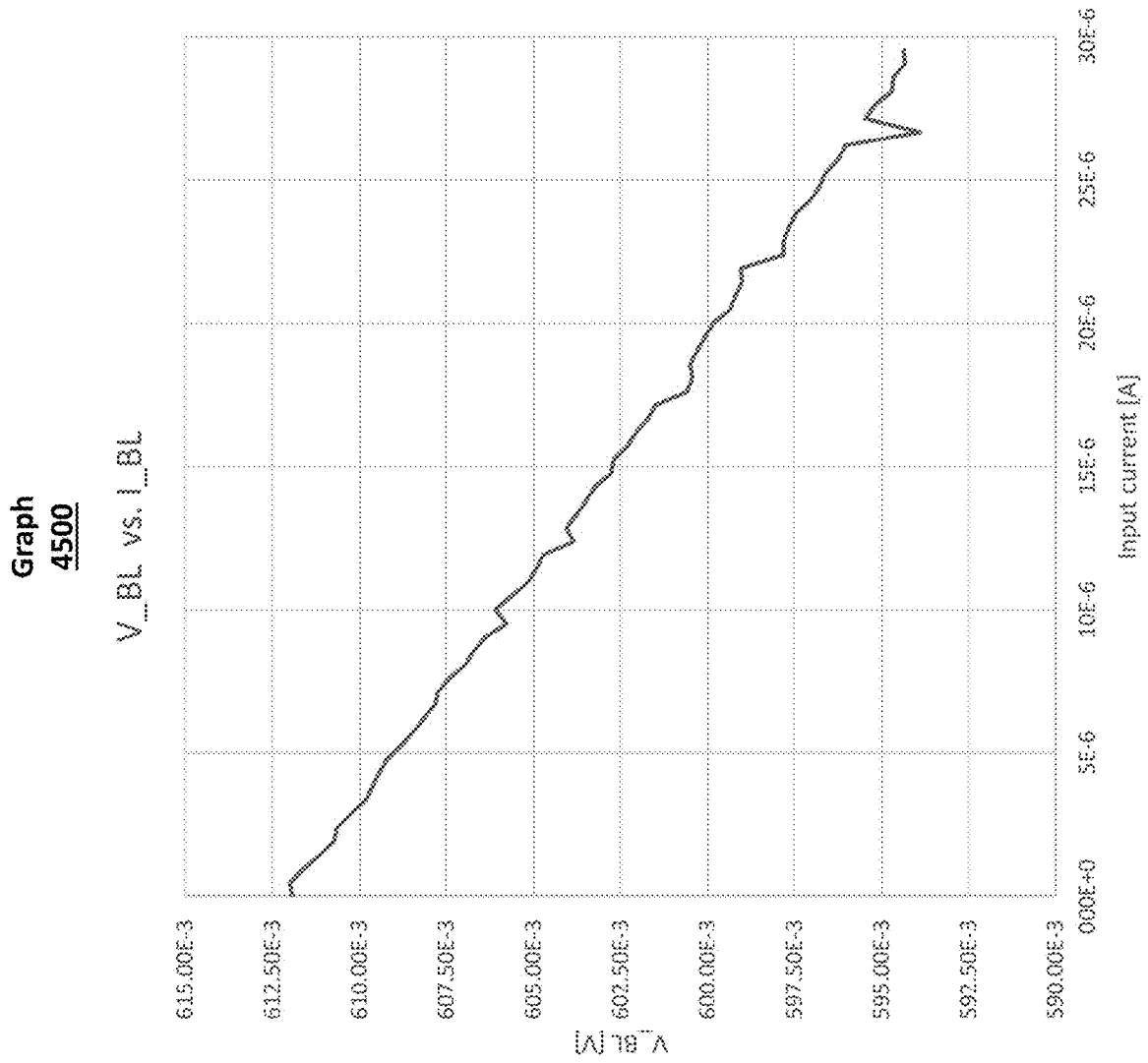
FIG. 45 depicts a graph of bitline voltage versus bitline current.

FIG. 45 depicts graph 4500 that illustrates the operation of sigma-delta ADCs 3600, 3700, 3800, 3900, 4000, 4100, 4200, and 4300, respectively. Graph 4500 shows the relationship between VBL and IBL, where VBL is the voltage at the BL node of memory cells 3711, 3811, 3911, 4011, 4111, respectively, and IBL is the drawn current from the BL node by VMM array 3401 that is coupled to an input of comparators 3701, 3801, 3901, 4001, 4101, 4201, and 4301, respectively. As shown, large VBL changes occur across the range of array current, hence improvement is desirable to reduce the voltage variation across the shown current range.

Figure 46:
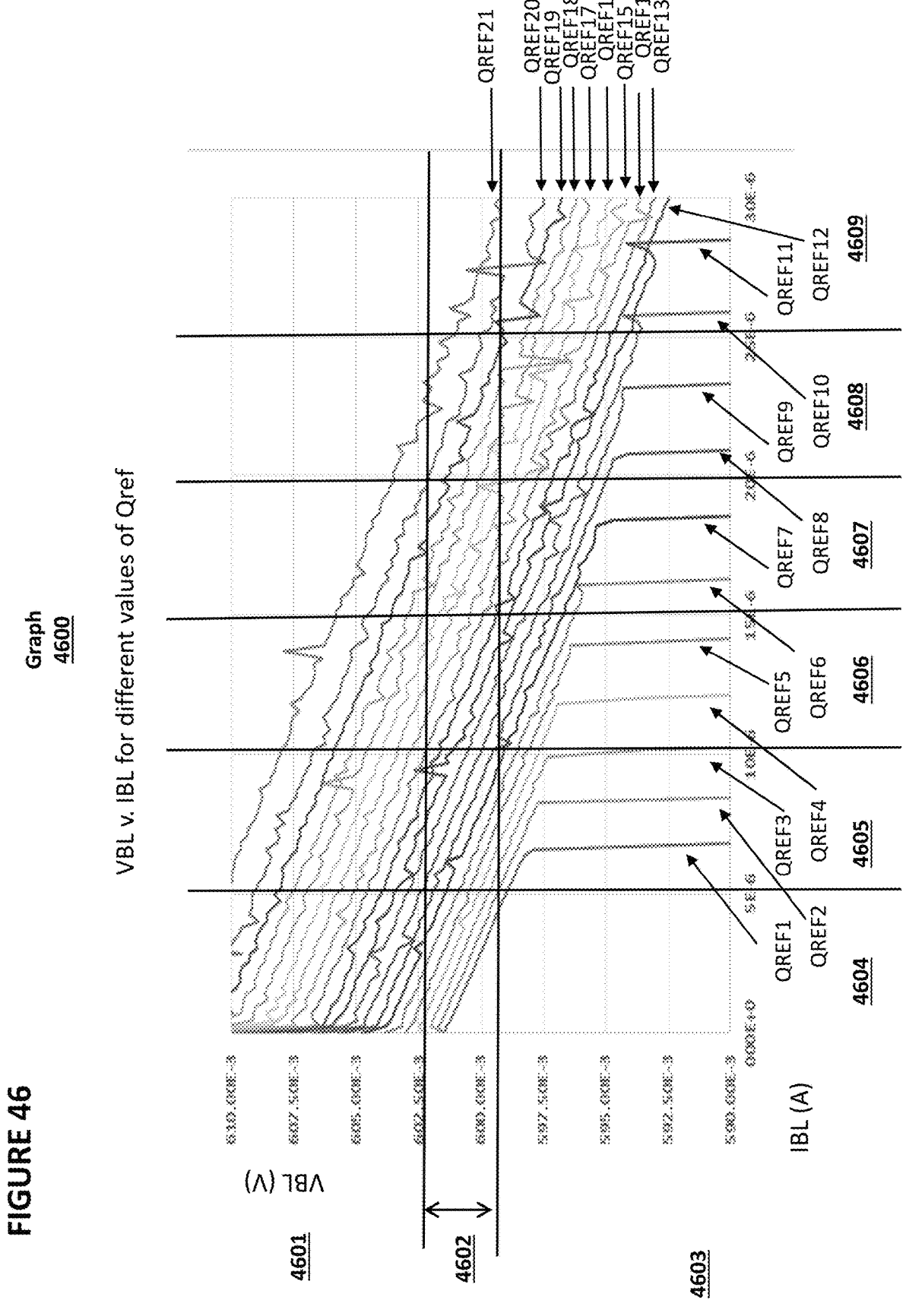
FIG. 46 depicts a graph of bitline voltage versus bitline current for various values of Qref.

FIG. 46 depicts graph 4600 that illustrates the operation of sigma-delta ADCs 3600, 3700, 3800, 3900, 4000, 4100, 4200, and 4300. Graph 4600 shows the relationship between VBL and IBL, where VBL is the voltage at the BL node of memory cells 3711, 3811, 3911, 4011, 4111, respectively, and IBL is the drawn current from the BL node by VMM array 3401 that is coupled to an input of comparators 3701, 3801, 3901, 4001, 4101, 4201, and 4301.

Graph 4600 depicts tracings of VBL and IBL for different values of Qref, where Qref is the reference charge injected into the bitline. Here, tracings for 21 examples of Qref are shown: QREF1, QREF2, . . . , QREF20, QREF21. These are examples, and any number of different Qref values can be used. SMs 3702, 3802, 3902, 4002, 4102, 4202, and 4302 can be programmed to modify the Qref based on the range of input current, IBL, that is being received or that is expected. A Qref value can be selected for each current range using the following algorithm.

First, the range of possible voltages for VBL are divided into a plurality of ranges. Here, three example voltage ranges are shown: voltage ranges 4601, 4602, and 4603. Within each voltage range, an amount of acceptable error is determined. For example, for (VBL) voltage range 4602, the voltage varies from approximately 599 mV to 601.5 mV, and the acceptable error is 2.5 mV.

Second, with this acceptable error in mind, the range of possible currents for IBL are divided into a plurality of ranges. Here, six example current ranges are shown: current ranges 4604, 4605, 4606, 4607, 4608, and 4609. Within each current range, one or more Qref values are identified that result in voltage tracings that are within the amount of acceptable error for the voltage range, or alternatively, Qref values that are unacceptable are identified.

For example, in current range 4604, QREF1 to QREF4 might be acceptable because their tracings are fairly linear but some other QREFs might be unacceptable because they exhibit nonlinearities near the beginning or the end of the range or out of acceptable range 4602.

In current range 4605, QREF1, QREF2, and QREF3 might be deemed unacceptable because their tracings exhibit a nonlinearity (e.g., the large drop off) within that current range, QREF4 to QREF9 are acceptable while all other QREFs might be deemed unacceptable because their tracings exhibit a nonlinearity or are out of voltage range 4602.

In current range 4606, QREF1 to QREF 8 might be deemed unacceptable because they do not even operate in voltage range 4602 and QREF 10 to QREF 13 are acceptable within the 4602 range and have tracings that are fairly linear.

Similarly, in current range 4607, QREF1 to QREF12 might be deemed unacceptable and QREF13 to QREF16 are acceptable.

Similarly, in current range 4608, QREF1 to QREF16 might be deemed unacceptable and QREF17 to QREF20 are acceptable.

Similarly in current range 4609, QREF1 to QREF19 might be deemed unacceptable and QREF20 to QREF21 are acceptable.

Because smaller QREFs are easier and faster to generate (for example, due to capacitive charging time), SMs 3702, 3802, 3902, 4002, 4102, 4202, and 4302 might choose the smallest acceptable QREF for each range. For example, SMs 3702, 3802, 3902, 4002, 4102, 4202, and 4302 might select QREF3 for current range 4604, QREF8 for current range 4605, QREF12 for current range 4606, QREF16 for current range 4607, QREF20 for current range 4608, and QREF21 for current range 4609.

Figure 47:
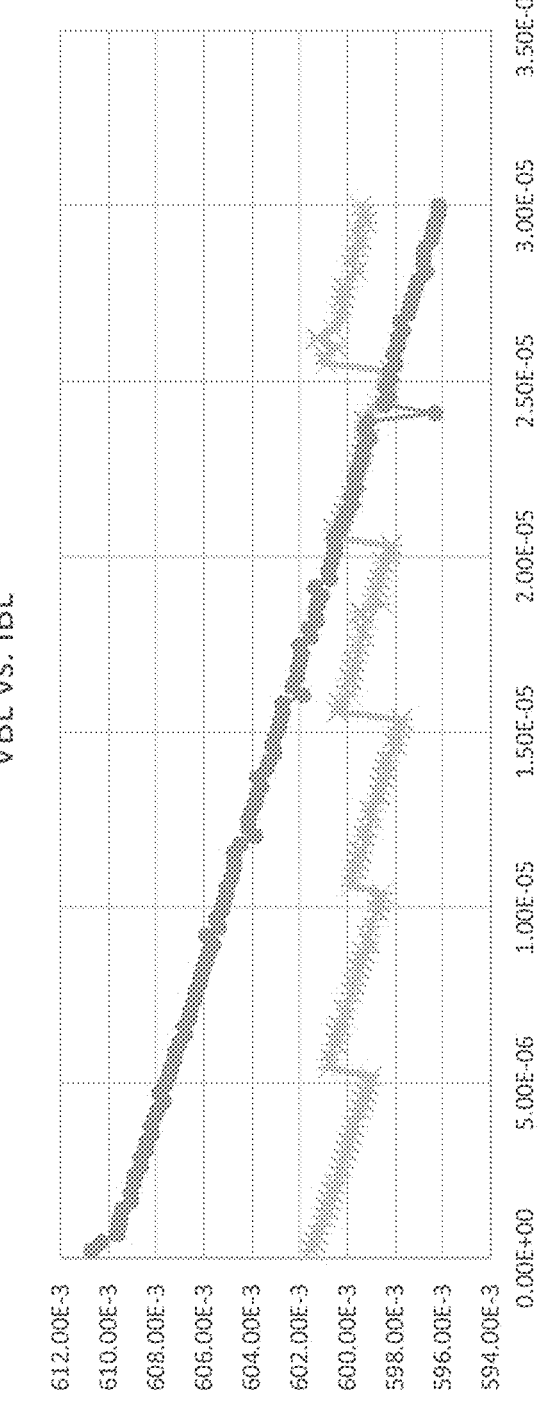
FIG. 47 depicts a graph of bitline voltage versus bitline current.

FIG. 47 depicts graph 4700 that illustrate the operation of sigma-delta ADCs 3600, 3700, 3800, 3900, 4000, 4100, 4200, and 4300. Graph 4700 shows the relationship between VBL and IBL, where VBL is the voltage at the BL node of memory cells 3711, 3811, 3911, 4011, 4111, respectively, and IBL is the drawn current from the BL node by VMM array 3401 that is coupled to an input of comparators 3701, 3801, 3901, 4001, 4101, 4201, and 4301, respectively. As shown, the current range is divided into 6 regions, and a different QREF is used in each region by adjusting the values of CREFs, IREFs, VSUPREFs based on the design of the sigma-delta ADC. SMs 3702, 3802, 3902, 4002, 4102, 4202, and 4302 may select the specific CREF/IREF/VSU-PREF values based on a measured current range of the VMM array, for example, by monitoring the digital output bits to decide on a current range based on the value of the bits, so as to achieve a more linear range among the various choices illustrated in the tracings of graphs 4500 and 4600 or choices not shown. Optionally, the values can be changed by the SM during operation of the ADC.

FIG. 48 depicts output circuit 4800, which comprises current-to-voltage converter 4801 and sigma-delta ADC 4802. Current-to-voltage converter 4801 receives a bit line current from VMM array 3401 (not shown) and converts the current into a voltage, ITV_Ox, which is provided to SD ADC 4802 which converts the voltage into a digital output [n:1].

FIG. 49 depicts output circuit 4900, which comprises current-to-voltage converter 4901 and sigma-delta ADC 4902. Current-to-voltage converter 4901 receives different bit line currents IBL+ and IBL− from VMM array 3401 (not shown) and converts the differential currents into differential voltages, ITV_O+ and ITV_O−, which are provided to SD ADC 4902 which converts the voltage into a digital output [n:1]. A sigma-delta ADC (not shown) operates on the voltages not current in this case.

Figure 50:
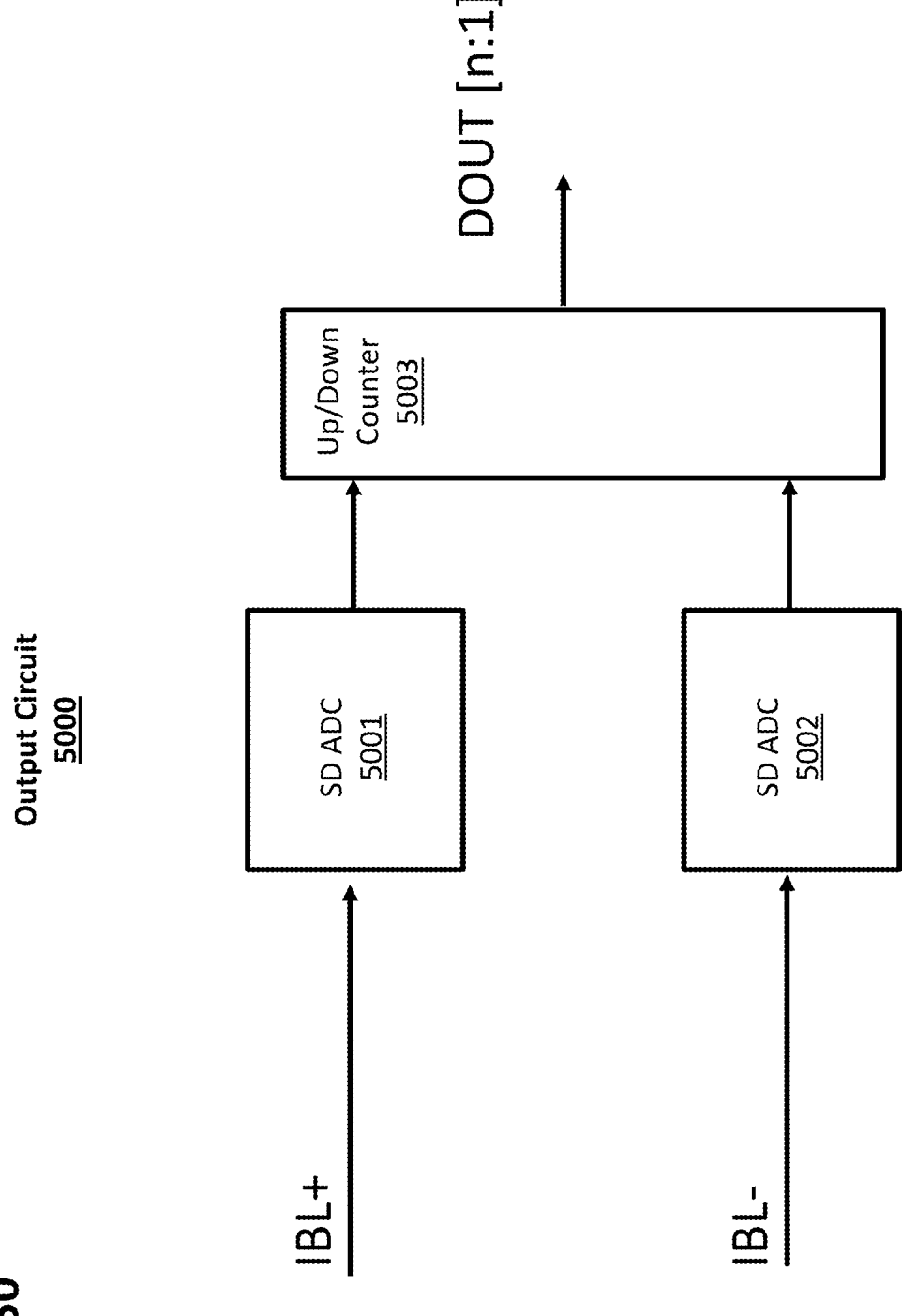
FIG. 50 depicts an output circuit.

FIG. 50 depicts a differential output circuit 5000 in which the digital output bits represent a differential weight, e.g., W=(W+)−(W−) or IBL=(IBL+)−(IBL−). Sigma-delta ADCs 5001 and 5002 can be any of sigma-delta ADCs 3600, 3700, 3800, 3900, 4000, 4100, 4200, and 4300. During operation, IBL+ is converted by sigma-delta ADC 5001 into digital bits and its result is stored in up/down counter 5003 by starting with a middle value and counting up by the value of the digital bits. IBL− is then converted by sigma-delta ADC 5002 into digital bits and its result is used to count down the value in the counter 5003. Hence the final value output by up/down counter 5003, DOUT[n:1], is the differential weight represented by (IBL+)-(IBL−). For example, if up/down counter 5003 is an 8-bit counter, a middle value might be 127 (01000000). Counting up with the output of sigma-delta ADC 5001 will result in a value between 127 and 255, and counting down will yield a final value between 0 to 255, with 128-255 representing a positive weight and 0-127 representing a negative weight.

As used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:

a vector-by-matrix multiplication array comprising an array of non-volatile memory cells arranged in rows and columns; and a sigma-delta analog-to-digital converter to receive a current from a column of the vector-by-matrix multiplication array and to generate a digital output in response to the current, wherein the sigma-delta analog-to-digital converter comprises:

a current source or a capacitor;

a switch;

a comparator comprising a first input terminal coupled to the column and to the current source or the capacitor through the switch, a second input terminal coupled to a reference voltage, and an output terminal to provide an output; and a state machine to receive the output from the comparator, to generate a control signal in response to a clock signal, to control the switch with the control signal, and to generate the digital output in response to the current, the digital output indicating a value of the current drawn by the column.

2. A system comprising:

a vector-by-matrix multiplication array comprising an array of non-volatile memory cells arranged in rows and columns; and a sigma-delta analog-to-digital converter to receive a current from a column of the vector-by-matrix multiplication array and to generate a digital output in response to the current;

wherein the sigma-delta analog-to-digital converter comprises:

a variable voltage source;

a capacitor;

a switch;

a comparator comprising a first input terminal coupled to the column and to the capacitor through the switch, a second input terminal coupled to a reference voltage, and an output terminal to provide an output; and a state machine to receive the output from the comparator, to provide a first control signal to the switch and a second control signal to the variable voltage source, and to generate the digital output in response to the current, the digital output indicating a value of the current drawn by the column.

3. A system comprising:

a vector-by-matrix multiplication array comprising an array of non-volatile memory cells arranged in rows and columns; and a sigma-delta analog-to-digital converter to receive a current from a column of the vector-by-matrix multiplication array and to generate a digital output in response to the current;

wherein the sigma-delta analog-to-digital converter comprises:

a capacitor;

a switch;

a transistor;

a control circuit;

a comparator comprising a first input terminal coupled to the column and to the capacitor through the switch and the transistor, a second input terminal coupled to a reference voltage, and an output terminal to provide an output; and a state machine to receive the output from the comparator, to provide a first control signal to the switch and a second control signal to the control circuit, and to generate the digital output in response to the current, the digital output indicating a value of the current drawn by the column.

4. A system comprising:

a vector-by-matrix multiplication array comprising an array of non-volatile memory cells arranged in rows and columns; and a sigma-delta analog-to-digital converter to receive a current from a column of the vector-by-matrix multiplication array and to generate a digital output in response to the current;

wherein the sigma-delta analog-to-digital converter comprises:

an adjustable capacitor;

a switch;

a comparator comprising a first input terminal coupled to the column and to the adjustable capacitor through the switch, a second input terminal coupled to a reference voltage, and an output terminal to provide an output; and a state machine to receive the output from the comparator, to provide a first control signal to the switch and a second control signal to the adjustable capacitor, and to generate the digital output in response to the current, the digital output indicating a value of the current drawn by the column.

5. The system of claim 4, wherein the sigma-delta analog-to-digital converter comprises:

a second adjustable capacitor coupled to the first input terminal of the comparator.

6. A system comprising:

a vector-by-matrix multiplication array comprising an array of non-volatile memory cells arranged in rows and columns; and an analog-to-digital converter to receive a current from a column of the vector-by-matrix multiplication array and to generate a digital output in response to the current, wherein a variable charge or a variable current is injected by an injection circuit to keep a voltage of the column approximately constant during operation;

wherein the variable charge is provided by a variable voltage supply coupled to a capacitor.

7. A system comprising:

a vector-by-matrix multiplication array comprising an array of non-volatile memory cells arranged in rows and columns; and an analog-to-digital converter to receive a current from a column of the vector-by-matrix multiplication array and to generate a digital output in response to the current, wherein a variable charge or a variable current is injected by an injection circuit to keep a voltage of the column approximately constant during operation;

wherein the variable charge is varied by changing a capacitance value of a variable capacitor.

8. A system comprising:

a vector-by-matrix multiplication array comprising an array of non-volatile memory cells arranged in rows and columns; and an analog-to-digital converter to receive a current from a column of the vector-by-matrix multiplication array and to generate a digital output in response to the current, wherein a variable charge or a variable current is injected by an injection circuit to keep a voltage of the column approximately constant during operation; and an up/down counter to determine a differential weight provided by two columns in the vector-by-matrix multiplication array.

9. The system of claim 8 comprising a second analog-to-digital converter.

10. The system of claim 9, wherein the analog-to-digital converter generates a first value that the up/down counter uses for an up count and the second analog-to-digital converter generates a second value that the up/down counter uses for a down count.

11. A method comprising:

converting current from an array of non-volatile memory cells arranged in rows and columns into digital output bits, the converting comprising injecting a variable charge or a variable current until a voltage of a column is equal to a reference voltage within a target voltage range;

wherein the variable charge is provided by an adjustable capacitor.

12. A method comprising:

converting current from an array of non-volatile memory cells arranged in rows and columns into digital output bits, the converting comprising injecting a variable charge or a variable current until a voltage of a column is equal to a reference voltage within a target voltage range;

wherein the variable charge is provided by a capacitor with a variable supply reference voltage supplied on a terminal of the capacitor.

13. A method comprising:

converting current from an array of non-volatile memory cells arranged in rows and columns into digital output bits, the converting comprising injecting a variable charge or a variable current until a voltage of a column is equal to a reference voltage within a target voltage range;

wherein the variable charge is provided by a plurality of capacitors.

\* \* \* \* \*